(12) United States Patent
Shen et al.

(10) Patent No.: US 11,659,771 B2
(45) Date of Patent: May 23, 2023

(54) STRUCTURE AND METHOD FOR INTEGRATING MRAM AND LOGIC DEVICES

(71) Applicant: Taiwan Semiconductor Manufacturing Company, Ltd., Hsinchu (TW)

(72) Inventors: Hsiang-Ku Shen, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 176 days.

(21) Appl. No.: 17/104,203

(22) Filed: Nov. 25, 2020

(65) Prior Publication Data

US 2022/0165940 A1 May 26, 2022

(51) Int. Cl.
*H01L 43/12* (2006.01)
*H01L 43/02* (2006.01)
*H01L 27/22* (2006.01)

(52) U.S. Cl.
CPC ............ *H01L 43/12* (2013.01); *H01L 27/228* (2013.01); *H01L 43/02* (2013.01)

(58) Field of Classification Search
CPC ...... H01L 43/12; C23C 16/045; C23C 16/401
See application file for complete search history.

(56) References Cited

U.S. PATENT DOCUMENTS

| | | | |
|---|---|---|---|
| 6,873,535 B1 | 3/2005 | Wang et al. | |
| 6,946,698 B1 | 9/2005 | Lin et al. | |
| 7,099,176 B2 | 8/2006 | Tang et al. | |
| 7,170,775 B2 | 1/2007 | Tang et al. | |
| 9,449,841 B2 | 9/2016 | Suen et al. | |
| 9,777,378 B2 | 10/2017 | Nemani et al. | |
| 10,270,025 B2 | 4/2019 | Chuang et al. | |
| 2002/0155795 A1* | 10/2002 | Ferra | B24B 29/00 451/57 |
| 2009/0166817 A1 | 12/2009 | Tsai et al. | |
| 2011/0151677 A1* | 6/2011 | Wang | H01L 21/02343 257/E21.283 |

(Continued)

OTHER PUBLICATIONS

Shen, Hsiang-Ku, et al., "Semiconductor Memory Device And Method Of Forming The Same," U.S. Appl. No. 16/998,911, filed Aug. 20, 2020, Assignee: Taiwan Semiconductor Manufacturing Co., Ltd., 22 pages specification, 20 pages drawings.

*Primary Examiner* — Shih Tsun A Chou
(74) *Attorney, Agent, or Firm* — Haynes and Boone, LLP

(57) ABSTRACT

A method includes providing a structure having a memory region and a logic region; a first metal layer and a dielectric barrier layer over the first metal layer in both the memory region and the logic region; a first dielectric layer over the dielectric barrier layer; multiple magnetic tunneling junction (MTJ) devices over the first metal layer, the dielectric barrier layer, and the first dielectric layer; and a second dielectric layer over the first dielectric layer and the MTJ devices. The first dielectric layer, the MTJ devices, and the second dielectric layer are in the memory device region and not in the logic device region. The method further includes depositing an extreme low-k (ELK) dielectric layer using FCVD over the memory region and the logic region; and buffing the ELK dielectric layer to planarize a top surface of the ELK dielectric layer.

20 Claims, 22 Drawing Sheets

(56) References Cited

U.S. PATENT DOCUMENTS

| | | |
|---|---|---|
| 2014/0377954 A1 | 12/2014 | Lu et al. |
| 2016/0194758 A1* | 7/2016 | Nemani ................ C23C 16/401 |
| | | 427/527 |
| 2017/0194557 A1* | 7/2017 | Chuang ................ H01L 27/228 |
| 2017/0114465 A1 | 10/2017 | Kalutarage et al. |
| 2018/0002571 A1* | 1/2018 | Stender ............... H01L 21/7684 |
| 2020/0098976 A1* | 3/2020 | Jacob ..................... H01L 43/12 |
| 2020/0098978 A1 | 3/2020 | Liao et al. |
| 2021/0242129 A1* | 8/2021 | Guo ................. H01L 21/76802 |

* cited by examiner

STRUCTURE AND METHOD FOR INTEGRATING MRAM AND LOGIC DEVICES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement in some IC design and fabrication has been the developing of non-volatile memory (NVM), and particularly magnetic random-access memory (MRAM). MRAM offers comparable performance to volatile static random-access memory (SRAM) and comparable density with lower power consumption than volatile dynamic random-access memory (DRAM). Compared to NVM Flash memory, MRAM may offer faster access times and suffer less degradation over time. An MRAM cell is formed by a magnetic tunneling junction (MTJ) comprising two ferromagnetic layers which are separated by a thin insulating barrier and operate by tunneling of electrons between the two ferromagnetic layers through the insulating barrier. Although existing approaches in MRAM device formation have generally been adequate for their intended purposes, they have not been entirely satisfactory in all respects. For example, it is desirable to integrate MRAM devices and other devices (such as MOS transistors) more efficiently in advanced technology nodes in view of the resolution limit of both lithography and etching techniques.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
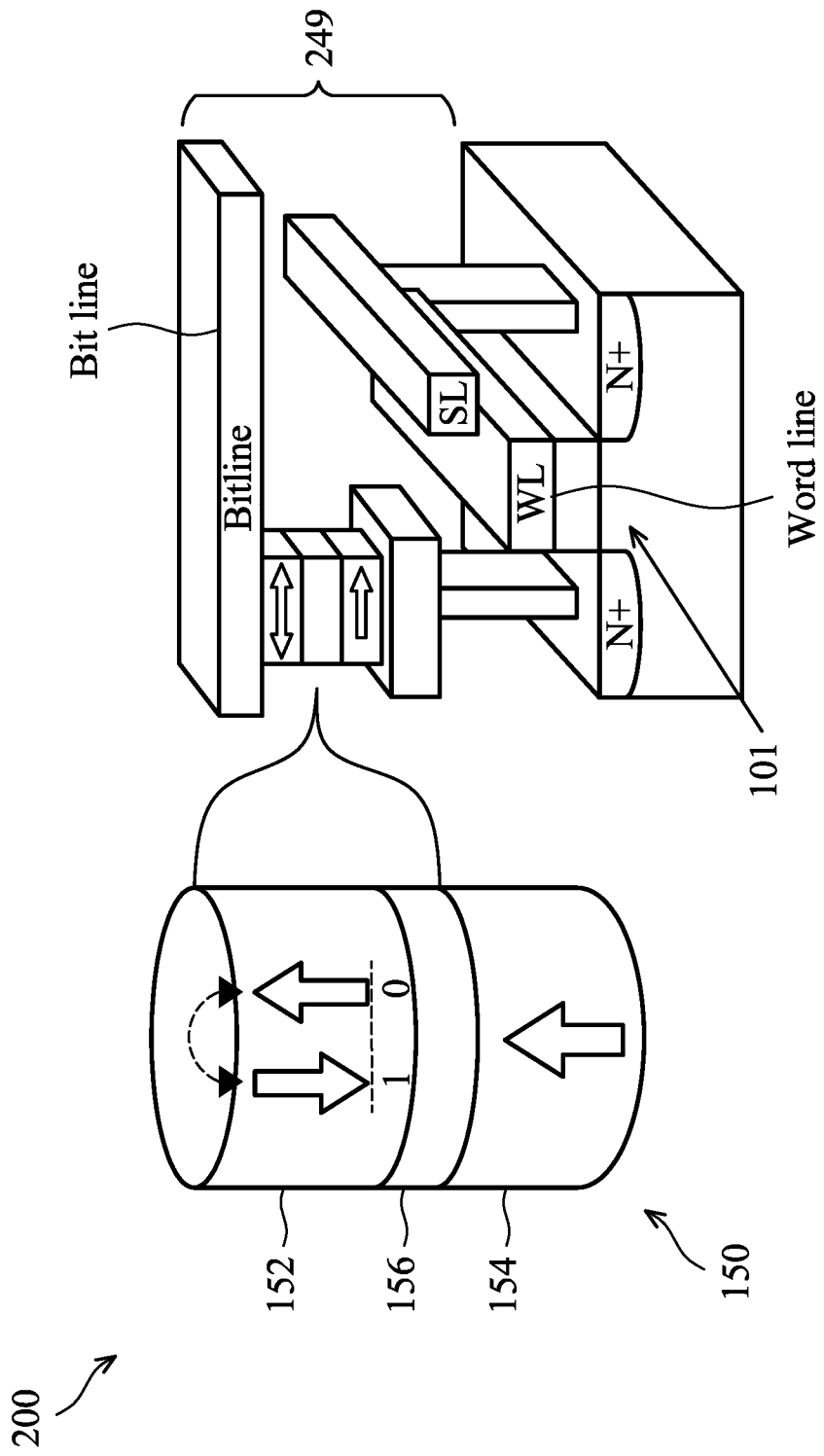
FIGS. 1A and 1B illustrate perspective views of a semiconductor device with an MRAM integrated therein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

The present disclosure is generally related to semiconductor devices and fabrication methods. More particularly, the present disclosure is related to providing a semiconductor device with MRAM devices and logic devices integrated therein. The MRAM devices are provided in an MRAM device region (or MRAM region) of the semiconductor device and the logic devices are provided in a logic device region (or logic region) of the semiconductor device. The MRAM includes an array of MRAM cells (or MRAM devices) arranged into row and columns. The MRAM cells in the same row are connected to a common word line, and the MRAM cells in the same column are connected to a common bit line. After forming MRAM cells in an interconnect layer, an embodiment of the present disclosure implements certain deposition and treatment processes (and without using photolithography processes) to form an extreme low-k (ELK) dielectric layer that has a substantially planar top surface in both the MRAM and the logic regions. This not only saves manufacturing costs, but also reduces the topographical variations at the top surface of the interconnect layer, thereby increasing process window for subsequent chemical mechanical planarization (CMP) process(es). Subsequently, conductive features such as wires and vias are formed into the ELK dielectric layer.

Figure 1B:
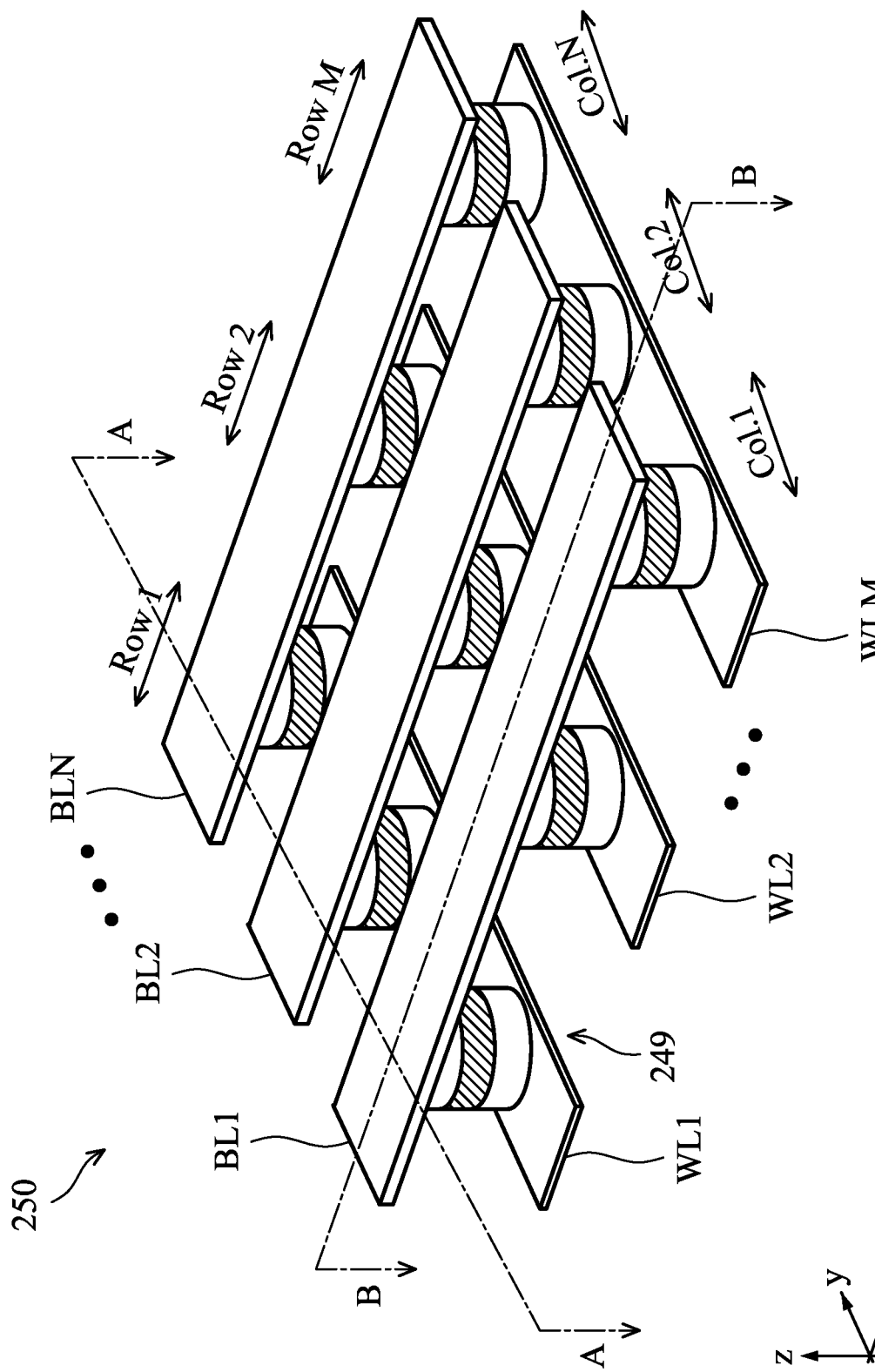

FIGS. 1A and 1B illustrate perspective views of a semiconductor device 200 having an MRAM array 250. Particularly, FIG. 1A illustrates a building block of the MRAM array 250—a MRAM cell 249 having an MTJ 150 (or MTJ stack 150). The MTJ 150 includes an upper ferromagnetic plate 152 and a lower ferromagnetic plate 154, which are separated by a thin insulating layer 156, also referred to as a tunnel barrier layer. One of the two ferromagnetic plates (e.g., the lower ferromagnetic plate 154) is a magnetic layer that is pinned to an antiferromagnetic layer, while the other ferromagnetic plate (e.g., the upper ferromagnetic plate 152) is a "free" magnetic layer that can have its magnetic field changed to one of two or more values to store one of two or more corresponding data states.

The MTJ 150 uses tunnel magnetoresistance (TMR) to store magnetic fields on the upper and lower ferromagnetic plates 152 and 154. For a sufficiently thin insulating layer 156 (e.g., about 10 nm or less thick), electrons can tunnel from the upper ferromagnetic plate 152 to the lower ferromagnetic plate 154. Data may be written to the cell in many ways. In one method, current is passed between the upper and lower ferromagnetic plates 152 and 154, which induces a magnetic field stored in the free magnetic layer (e.g., the upper ferromagnetic plate 152). In another method, spin-transfer-torque (STT) is utilized, wherein a spin-aligned or polarized electron flow is used to change the magnetic field within the free magnetic layer with respect to the pinned magnetic layer. Other methods to write data may be used. However, all data write methods include changing the magnetic field within the free magnetic layer with respect to the pinned magnetic layer.

The electrical resistance of the MTJ 150 changes in accordance with the magnetic fields stored in the upper and lower ferromagnetic plates 152 and 154, due to the magnetic tunnel effect. For example, when the magnetic fields of the upper and lower ferromagnetic plates 152 and 154 are aligned (or in the same direction), the MTJ 150 is in a low-resistance state (i.e., a logical "0" state). When the magnetic fields of the upper and lower ferromagnetic plates 152 and 154 are in opposite directions, the MTJ 150 is in a high-resistance state (i.e., a logical "1" state). The direction of the magnetic field of the upper ferromagnetic plate 152 can be changed by passing a current through the MTJ 150. By measuring the electrical resistance between the upper and lower ferromagnetic plates 152 and 154, a read circuitry coupled to the MTJ 150 can discern between the "0" and "1" states. FIG. 1A further shows that the upper ferromagnetic plate 152 of an MTJ 150 is coupled to a bit line, the lower ferromagnetic plate 154 of an MTJ 150 is coupled to a source (or drain) of a transistor in a transistor structure 101, the drain (or source) of the transistor is coupled to a supply line (SL), and the gate of the transistor is coupled to a word line (WL). The MTJ 150 can be accessed (such as read or written) through the bit line, word line, and the supply line.

FIG. 1B illustrates an MRAM 250, which includes M rows (words) and N columns (bits) of MRAM cells (or MUM devices) 249. Each MRAM cell 249 comprises an MTJ 150. Word lines $WL_1$, $WL_2$, . . . $WL_M$ extend along respective rows of MRAM cells 249 and bit lines $BL_1$, $BL_2$, . . . $BL_N$ extend along columns of MRAM cells 249.

Figure 1C:
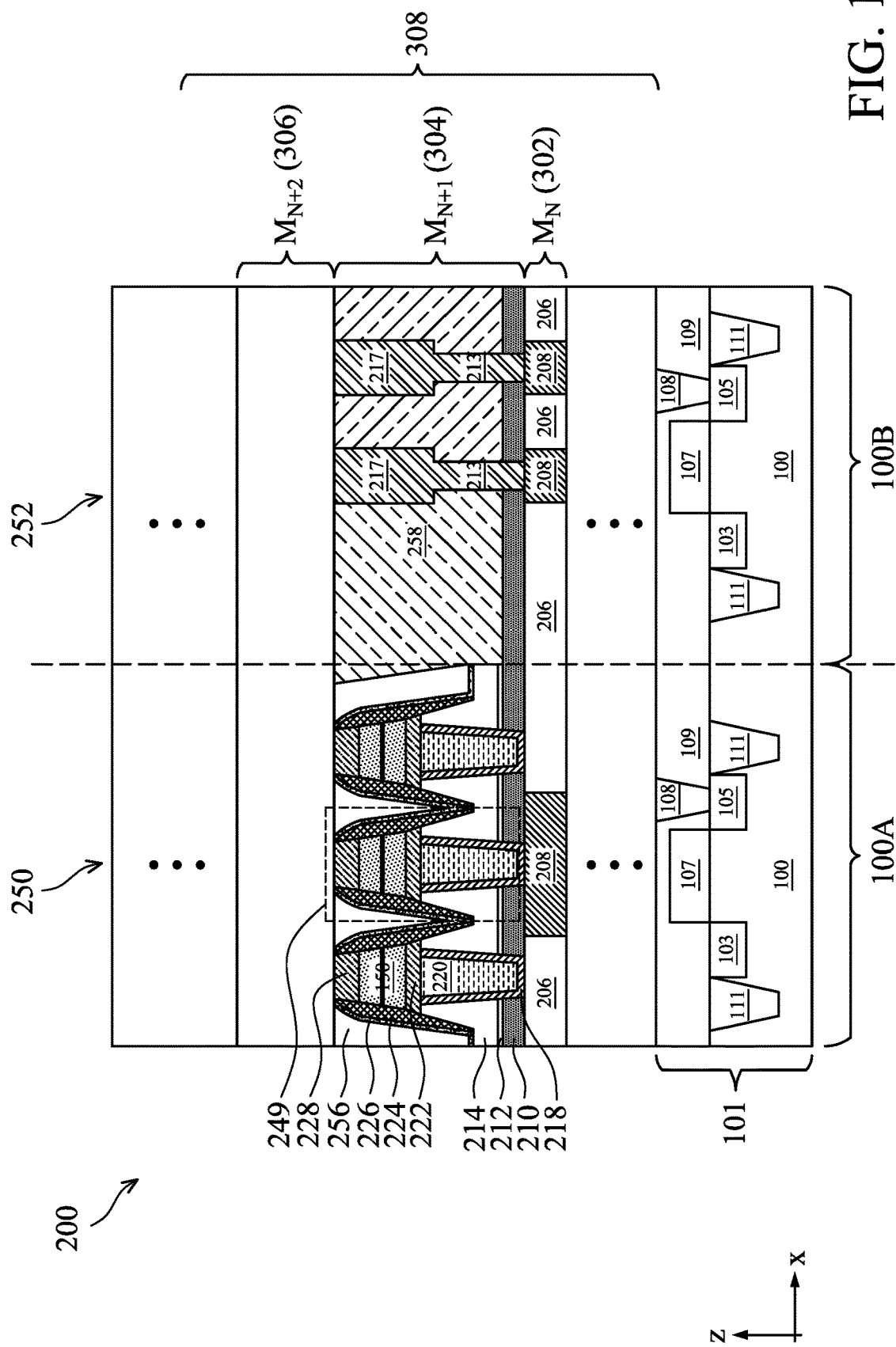
FIG. 1C illustrates a cross-sectional view of the semiconductor device in FIGS. 1A and 1B, in accordance with an embodiment.

FIG. 1C shows a cross-sectional view of the semiconductor device 200 along the bit line direction of the MRAM 250 (i.e., the B-B line in FIG. 1B), showing both the MRAM array 250 and logic devices 252 in the same figure, in accordance with some embodiments of the present disclosure. Referring to FIG. 1C, the MRAM 250 is provided in a MRAM region 100A, while the logic devices 252 are provided in a logic region 100B. The logic devices 252 may be used for implementing write/read logic for accessing the MRAM array 250 or perform other functions. The MRAM region 100A and the logic region 100B have a common transistor structure 101 in or on a semiconductor substrate 100.

In some embodiments, the semiconductor substrate 100 may be but is not limited to, a silicon substrate (such as a silicon wafer). Alternatively, the substrate 100 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the semiconductor substrate 100 is a semiconductor on insulator (SOI). In other alternatives, semiconductor substrate 100 may include a doped epitaxial layer, a gradient semiconductor layer, and/or a semiconductor layer overlying another semiconductor layer of a different type, such as a silicon layer on a silicon germanium layer. The semiconductor substrate 100 may or may not include doped regions, such as a p-well, an n-well, or combinations thereof.

The semiconductor substrate 100 further includes heavily doped regions such as sources 103 and drains 105 at least partially in the semiconductor substrate 100. A gate 107 is positioned over a top surface of the semiconductor substrate 100 and between the source 103 and the drain 105. Contact plugs 108 are formed in inter-layer dielectric (ILD) 109 and may be electrically coupled to the transistor structure 101. In some embodiments, the ILD 109 is formed on the semiconductor substrate 100. The ILD 109 may be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. The ILD 109 may be formed from a variety of dielectric materials such as an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The transistors in the transistor structure 101 can be planar transistors or non-planar transistor, such as FinFET.

In some embodiments, a shallow trench isolation (STI) 111 is provided to define and electrically isolate adjacent transistors. A number of STI 111 are formed in the semiconductor substrate 100. The STI 111 may, for example, include an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The STI 111 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), and the like. Alternatively, the STI 111 may also be formed of any suitable "low dielectric constant" or "low-k" dielectric material, where k is less than or equal to about 4.

FIG. 1C further illustrates that the semiconductor device 200 includes an interconnect structure 308 over the transistor structure 101. The interconnect structure 308 includes three adjacent metal layers 302, 304, and 306 and other metal layers not shown. The metal layer 302 is the $N^{th}$ metal layer above the top surface the transistor structure 101, while the metal layers 304 and 306 are the $(N+1)^{th}$ metal layer and the $(N+2)^{th}$ metal layer, respectively. Thus, the metal layers 302, 304, and 306 are also referred to metal layers $M_N$, $M_{N+1}$, and $M_{N+2}$ in some embodiments. The number N can be any natural number. For example, N may be 3, 4, 5, 6, or another natural number. In the present embodiment, the MRAM cells 249 are implemented in the metal layer 304.

The metal layer 302 includes an inter-metal dielectric (IMD) layer 206 and metal lines 208 in both the MRAM region 100A and the logic region 100B. The IMD layer 206 can be an oxide, such as silicon dioxide, a low-k dielectric material such as carbon doped oxides, or an extreme low-k dielectric material such as porous carbon doped silicon dioxide. The metal lines 208 can be made of a metal, such as aluminum, copper, or combinations thereof.

The metal layer 304 includes a dielectric barrier layer 210 that extends through both the MRAM region 100A and the logic region 100B. For example, the barrier 210 may include one or more dielectric materials such as $Si_3N_4$, SiON, SiC, SiCN, or a combination thereof in various embodiments. In the MRAM region 100A, the metal layer 304 further includes the MRAM cells 249 surrounded by one or more dielectric layers 210, 212, 214, 226, and 256. In the logic region 100B, the metal layer 304 further includes metal vias 213 and metal lines 217 surrounded by one or more dielectric layers 210 and 258. The various components in the metal layer 304 are further described below.

In an embodiment, the dielectric layer 212 includes a metal-based dielectric material, such as aluminum oxide (i.e., $AlO_x$ such as $Al_2O_3$). In an embodiment, the dielectric layer 214 includes a low-k dielectric material, such as a silicon oxide based low-k dielectric material. For example, the dielectric layer 214 may include tetraethylorthosilicate (TEOS) formed oxide, un-doped silicate glass (USG), or doped silicon oxide such as borophosphosilicate glass (BPSG), fused silica glass (FSG), phosphosilicate glass (PSG), boron doped silicon glass (BSG), and/or other suitable dielectric materials. In an embodiment, the dielectric layer 256 includes a dielectric material that is different from that of the dielectric layer 214. For example, the dielectric layer 256 may include a silicon nitride based dielectric material. For example, the dielectric layer 256 may include silicon carbonitride. In an embodiment, the dielectric layer 226 includes a dielectric material that is different from the materials in the dielectric layer 256 and the materials in a top electrode 228 (discussed below). For example, the dielectric layer 226 may include a metal-based dielectric material, such as aluminum oxide (i.e., $AlO_x$ such as $Al_2O_3$).

In the present embodiment, each MRAM cell 249 includes a bottom electrode via (BEVA) 220 and a conductive barrier layer 218 on sidewalls and a bottom surface of the BEVA 220. The conductive barrier layer 218 may be disposed directly on one of the metal lines 208 in the metal layer 302, which is connected to a via on one of the source and drain features of the transistors in the transistor structure 101 (such connection is not shown in FIG. 1C, but see FIG. 1A). The BEVA 220 may include tungsten, titanium, tantalum, tungsten nitride, titanium nitride, tantalum nitride, a combination thereof, or other suitable metal or metal compound. The barrier layer 218 may include titanium nitride, tantalum nitride, or other suitable conductive diffusion barrier. The barrier layer 218 is disposed between the BEVA 220 and the surrounding dielectric layers 210, 212, and 214.

In the present embodiment, each MRAM cell 249 further includes a bottom electrode (BE) 222 disposed on the BEVA 220, an MTJ (or MTJ stack) 150 disposed on the BE 222, and a top electrode (TE) 228 disposed on the MTJ 150. In an embodiment, each of the BE 222 and the TE 228 may include a metal nitride such as TaN, TiN, Ti/TiN, TaN/TiN, Ta or the combinations thereof. In some embodiments, the MTJ 150 may include ferromagnetic layers, MTJ spacers, and a capping layer. The capping layer is formed on the ferromagnetic layer. Each of the ferromagnetic layers may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The MTJ spacer may include non-ferromagnetic metal, for example, Ag, Au, Cu, Ta, W, Mn, Pt, Pd, V, Cr, Nb, Mo, Tc, Ru or the like. Another MTJ spacer may also include insulator, for example, $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer may reduce write current of its associated MRAM cell. The ferromagnetic layer may function as a free layer 152 (FIG. 1A) whose magnetic polarity or magnetic orientation can be changed during write operation of its associated MRAM cell 249. The ferromagnetic layers and the MTJ spacer may function as a fixed or pinned layer 154 (FIG. 1A) whose magnetic orientation may not be changed during operation of its associated MRAM cell 249. It is contemplated that the MTJ 150 may include an antiferromagnetic layer in accordance with other embodiments.

In the present embodiment, each MRAM cell 249 further includes dielectric spacers 224 (or MTJ spacers 224) on sidewalls of the MTJ 150, the bottom electrodes 222, and the top electrodes 228. The spacers 224 may include one or more dielectric materials such as silicon oxide ($SiO_x$), silicon nitride ($SiN_x$), silicon oxynitride ($Si_xO_yN_z$), or the like. The dielectric layer 226 is disposed over the spacers 224 and over the sidewalls of the TE 228 in the present embodiment. The dielectric layer 226 may include a metal-oxide based dielectric material, such as aluminum oxide (i.e., $AlO_x$ such as $Al_2O_3$).

In the present embodiment, the metal layer 304 in the logic region 100B includes the metal vias 213, the metal lines 217, and the dielectric layers 210 and 258. The metal vias 213 are electrically connected to some of the metal lines 208 in the metal layer 302. The metal vias 213 and the metal lines 217 can be made of a metal, such as aluminum, copper, or combinations thereof. The dielectric layer 258 includes an extreme low-k (ELK) dielectric material, for example, with a dielectric constant (k) less than about 2.5. For example, the dielectric layer 258 may be an ELK porous carbon doped silicon dioxide or an ELK dielectric material having silicon, oxygen, carbon, hydrogen, and nitrogen. A portion of the dielectric layer 258 extends into the MRAM region 100A. For example, a portion of the dielectric layer 258 is disposed directly on the sidewalls of the dielectric layer 256 in the MRAM region 100A. In some embodiments such as shown in FIG. 3P, portions of the dielectric layer 258 are disposed in space between adjacent top electrodes 228 in the MRAM region 100A. In such embodiments, the portions of the dielectric layer 258 in the MRAM region 100A and the portion of the dielectric layer 258 in the logic region 100B are co-planar or substantially co-planar. Further, the portion of the dielectric layer 258 in the logic region 100B is disposed directly on the barrier layer 210 in the present embodiment.

For simplicity purposes, the details of the metal layer 306 are not shown. The metal layer 306 includes metallic features surrounded by one or more dielectric layers. The dielectric layers extend across both the MRAM region 100A and the logic region 100B. Some of the metallic features are disposed in the MRAM region 100A and electrically connected to the top electrodes 228 of the MRAM cells 249. Some of the metallic features are disposed in the logic region 100B and electrically connected to the metal lines 217.

Figure 2A:
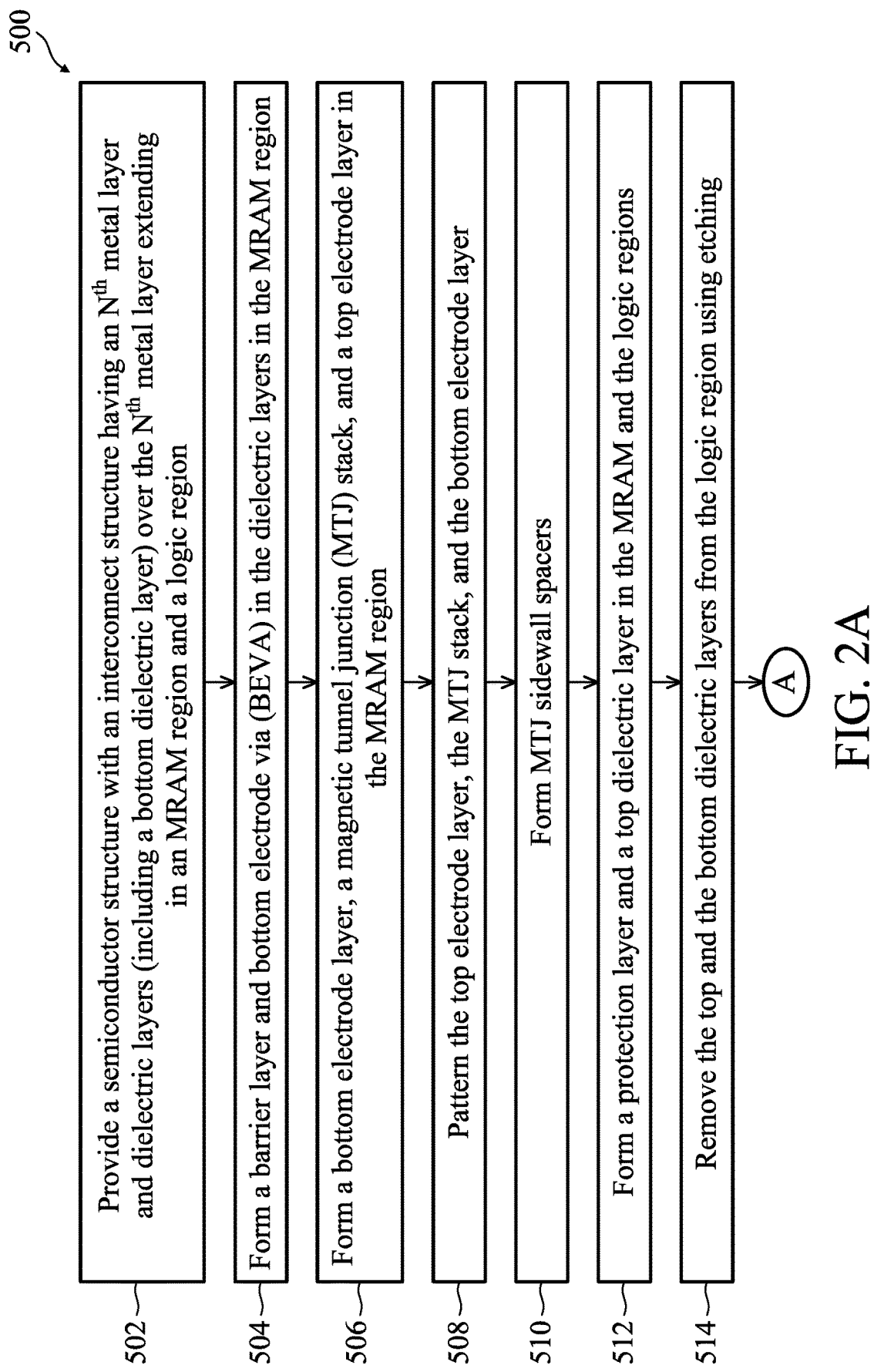
FIGS. 2A and 2B show a flow chart of a method for forming a semiconductor device with an MRAM array integrated therein, according to an embodiment of the present disclosure.
Figure 2B:
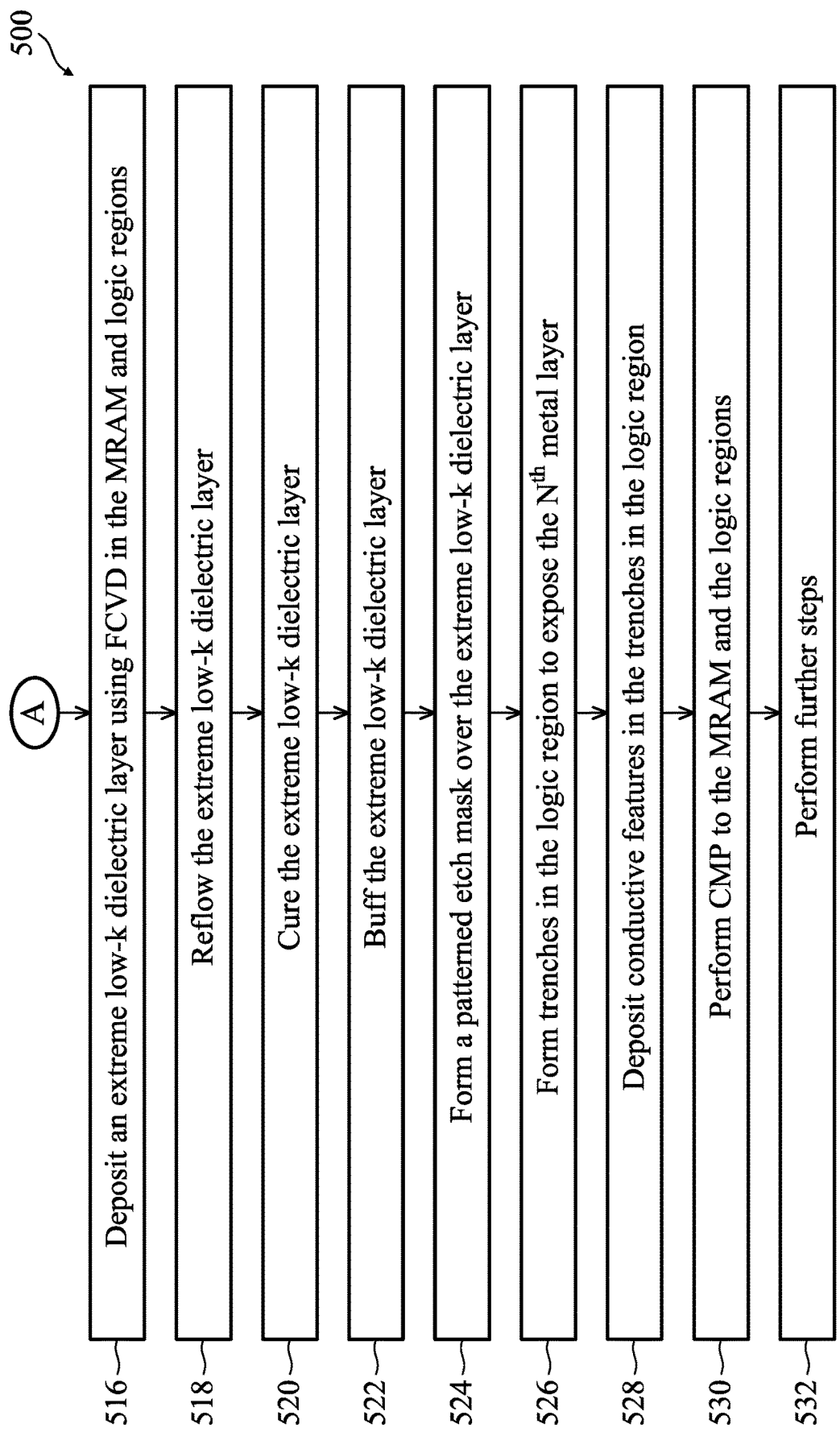

FIGS. 2A and 2B illustrate a flow chart of a method 500 for forming the semiconductor device 200 having an MRAM array and logic devices integrated in accordance with an embodiment. The method 500 is merely an example, not intended to limit the present disclosure beyond what is explicitly recited in the claims. Additional operations can be provided before, during, and after the method 500, and some operations described can be replaced, eliminated, or relocated for additional embodiments of the method. The method 500 is described below in conjunction with FIG. 3A through FIG. 3P-1, which illustrate various cross-sectional views of the semiconductor device 200 during fabrication steps according to the method 500.

Figure 3A:
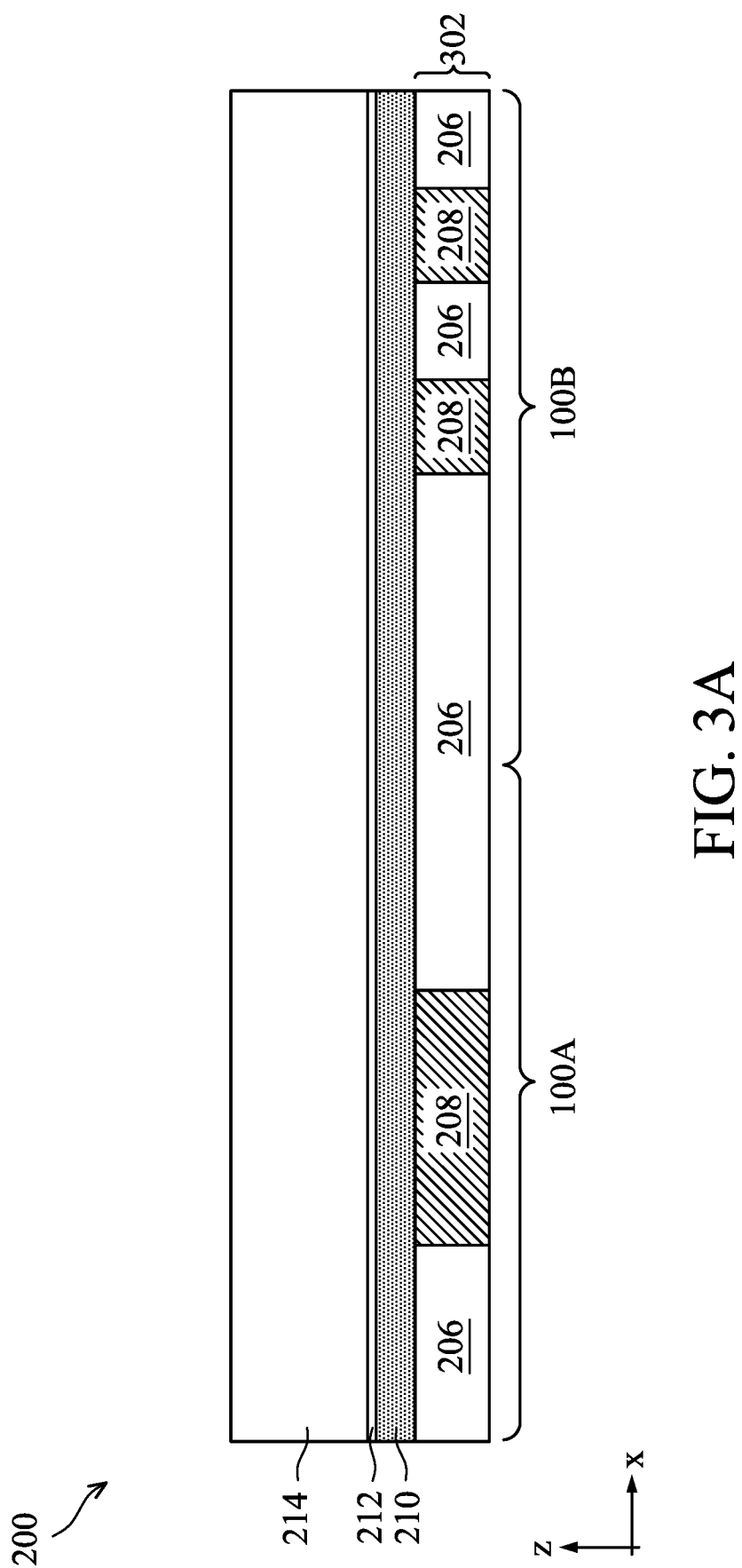
FIGS. 3A, 3B, 3C, 3D, 3E, 3F, 3G, 3H, 3I, 3J, 3K, 3L, 3M, 3N, 3O, 3P, and 3P-1 illustrate cross-sectional views of a semiconductor structure during a fabrication process according to the method of FIGS. 2A-2B, in accordance with some embodiments.

At operation 502, the method 500 (FIG. 2A) provides, or is provided with, a device structure 200 having a metal layer 302 and various dielectric layers 210, 212, and 214 disposed over the metal layer 302, such as shown in FIG. 3A. Although not shown in FIG. 3A, the device structure 200 further includes a transistor structure (such as the transistor structure 101 in FIG. 1C) disposed in or on a substrate (such as the substrate 100 in FIG. 1C) that is below the metal layer 302. The metal layer 302 is the $N^{th}$ metal layer above the transistor structure, where N is a natural number. The device structure 200 includes an MRAM region 100A for forming an MRAM array therein and a logic region 100B for forming logic devices therein. The metal layer 302 includes an IMD layer 206 and metal lines 208 in both the MRAM region 100A and the logic region 100B. The IMD layer 206 can be an oxide, such as silicon dioxide, a low-k dielectric material such as carbon doped oxides, or an extreme low-k dielectric material such as porous carbon doped silicon dioxide. The metal lines 208 can be made of a metal, such as aluminum, copper, or combinations thereof. The IMD layer 206 may be formed by deposition process, such as physical vapor deposition (PVD) or chemical vapor deposition (CVD) including plasma enhanced chemical vapor deposition (PECVD). The metal lines 208 be formed by a deposition process such as PVD, CVD, atomic layer deposition (ALD), or a plating process. In an embodiment, the dielectric barrier layer 210 may include one or more dielectric materials such as $Si_3N_4$, SiON, SiC, SiCN, or a combination thereof, and may be deposited using PVD, CVD, ALD, or other suitable processes to a thickness in a range of about 12 nm to about 20 nm. In an embodiment, the dielectric layer 212 includes a metal-based dielectric material, such as aluminum oxide, and may be deposited using CVD, ALD, or other suitable processes to a thickness in a range of about 2 nm to about 6 nm. In an embodiment, the dielectric layer 214 includes a silicon oxide based dielectric material such as un-doped silicate glass (USG) or tetraethylorthosilicate (TEOS) formed oxide, and may be deposited using CVD, PVD, or other suitable processes to a thickness in a range of about 40 nm to about 100 nm.

Figure 3B:
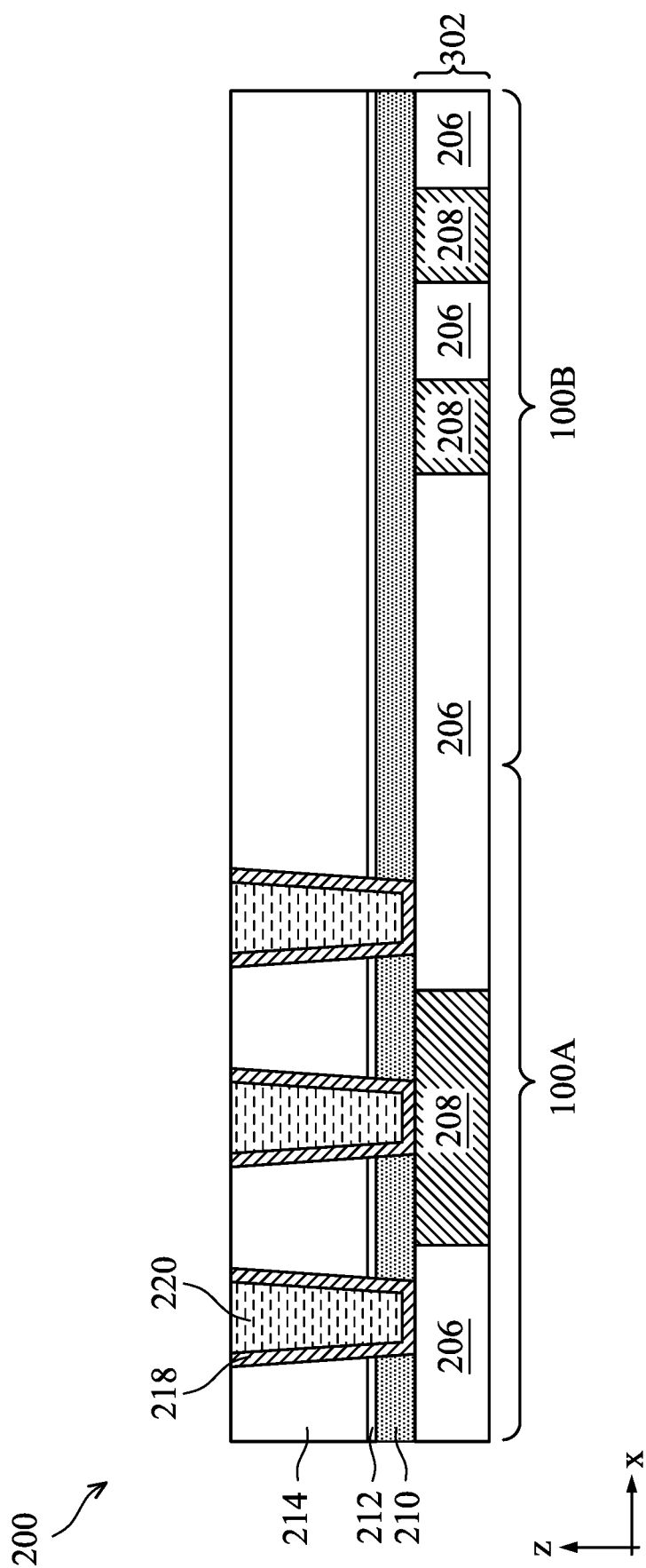

At operation 504, the method 500 (FIG. 2A) forms BEVA 220 and conductive barrier layer 218 that penetrate through the dielectric layers 214, 212, and 210 and electrically connect to some of the metal lines 208 in the MRAM region 100A, such as shown in FIG. 3B. For example, the operation 504 may form an etch mask over the dielectric layer 214 using photolithography and etching processes, where the etch mask provides openings corresponding to the location of the BEVA 220 and the barrier layer 218 and covers the rest of the device structure 200. In an embodiment, each BEVA 220 corresponds to an MRAM cell 249 in an MRAM array 250. Then, the operation 504 etches the dielectric layers 214, 212, and 210 through the etch mask to reach the metal layer 302, thereby forming openings (or trenches or holes) in the dielectric layers 214, 212, and 210. Subsequently, the operation 504 deposits the barrier layer 218 on the surfaces of the openings and deposits the BEVA 220 over the barrier layer 218. Thereafter, the operation 504 may perform a chemical mechanical planarization (CMP) process to the BEVA 220 and the barrier layer 218, thereby removing any excessive materials on the top surface of the dielectric layer 214. In an embodiment, the barrier layer 218 may include titanium nitride, tantalum nitride, or other suitable conductive diffusion barrier, and may be deposited using ALD, PVD, CVD, or other suitable deposition methods; and the BEVA 220 may include tungsten, titanium, tantalum, tungsten nitride, titanium nitride, tantalum nitride, a combination thereof, or other suitable metal or metal compound, and may be deposited using CVD, PVD, ALD, plating, or other suitable deposition methods.

Figure 3C:
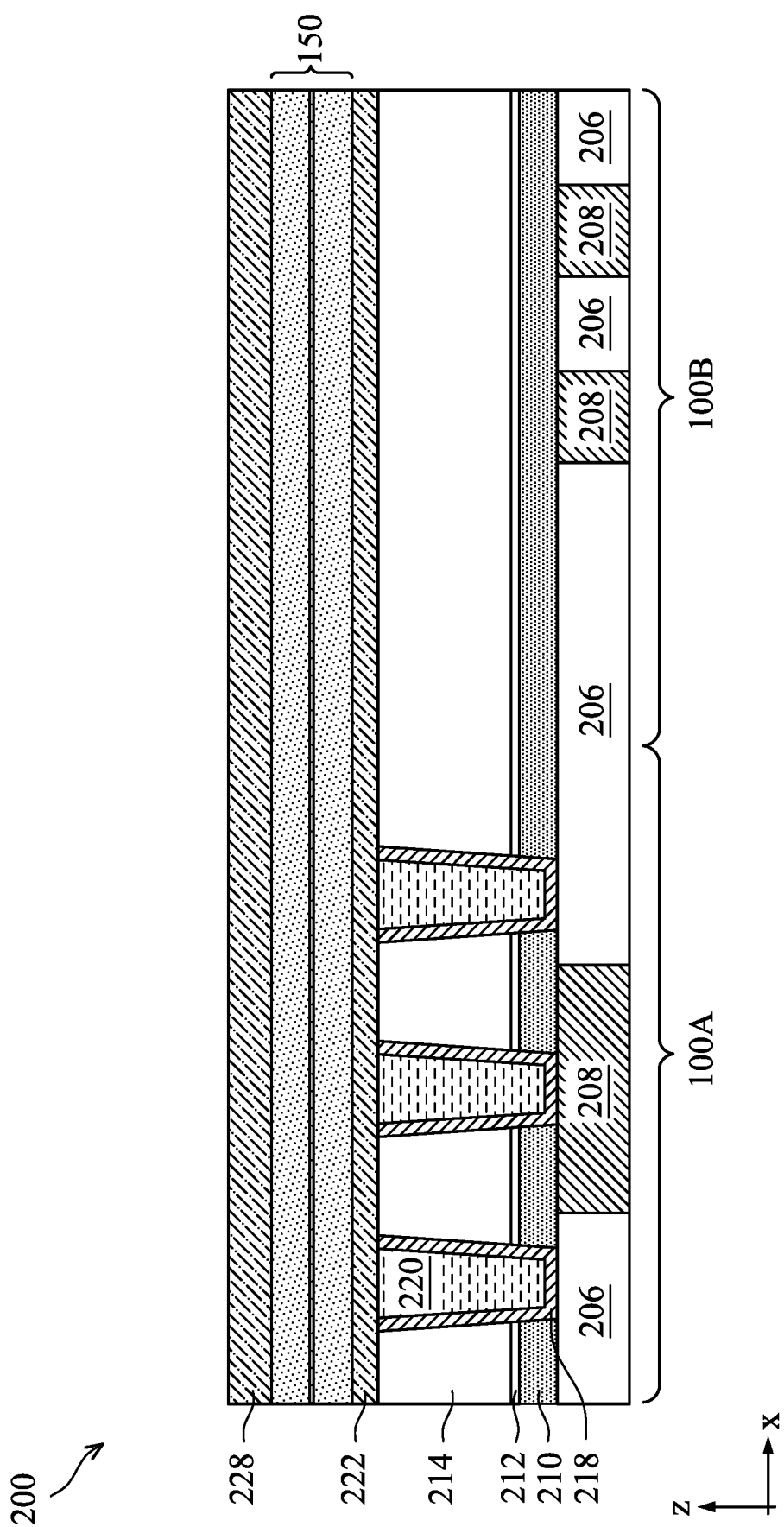

At operation 506, the method 500 (FIG. 2A) deposits a bottom electrode (BE) layer 222, an MTJ stack 150, and a top electrode (TE) layer 228 over the dielectric layer 214, the barrier layer 218, and the BEVA 220, such as shown in FIG. 3C. Particularly, the BE layer 222 electrically connects to the BEVA 220. In an embodiment, the BE 222 may include a metal nitride such as TaN, TiN, Ti/TiN, TaN/TiN, Ta, or a combination thereof, and may be deposited using CVD, ALD, or other suitable deposition methods. The BE 222 may be formed to have a thickness in a range about 1 nm to about 8 nm in some embodiments. The MTJ stack 150 may be deposited using CVD, PVD, ALD, or other suitable deposition methods, and may have a thickness in a range of about 20 nm to about 50 nm in some embodiments. In an embodiment, the TE 228 may include TaN, TiN, Ti/TiN, TaN/TiN, Ta, a combination thereof, or other materials, and may be deposited using CVD, ALD, or other suitable deposition methods. The TE 228 may be formed to have a thickness in a range about 10 nm to about 25 nm in some embodiments.

Figure 3D:
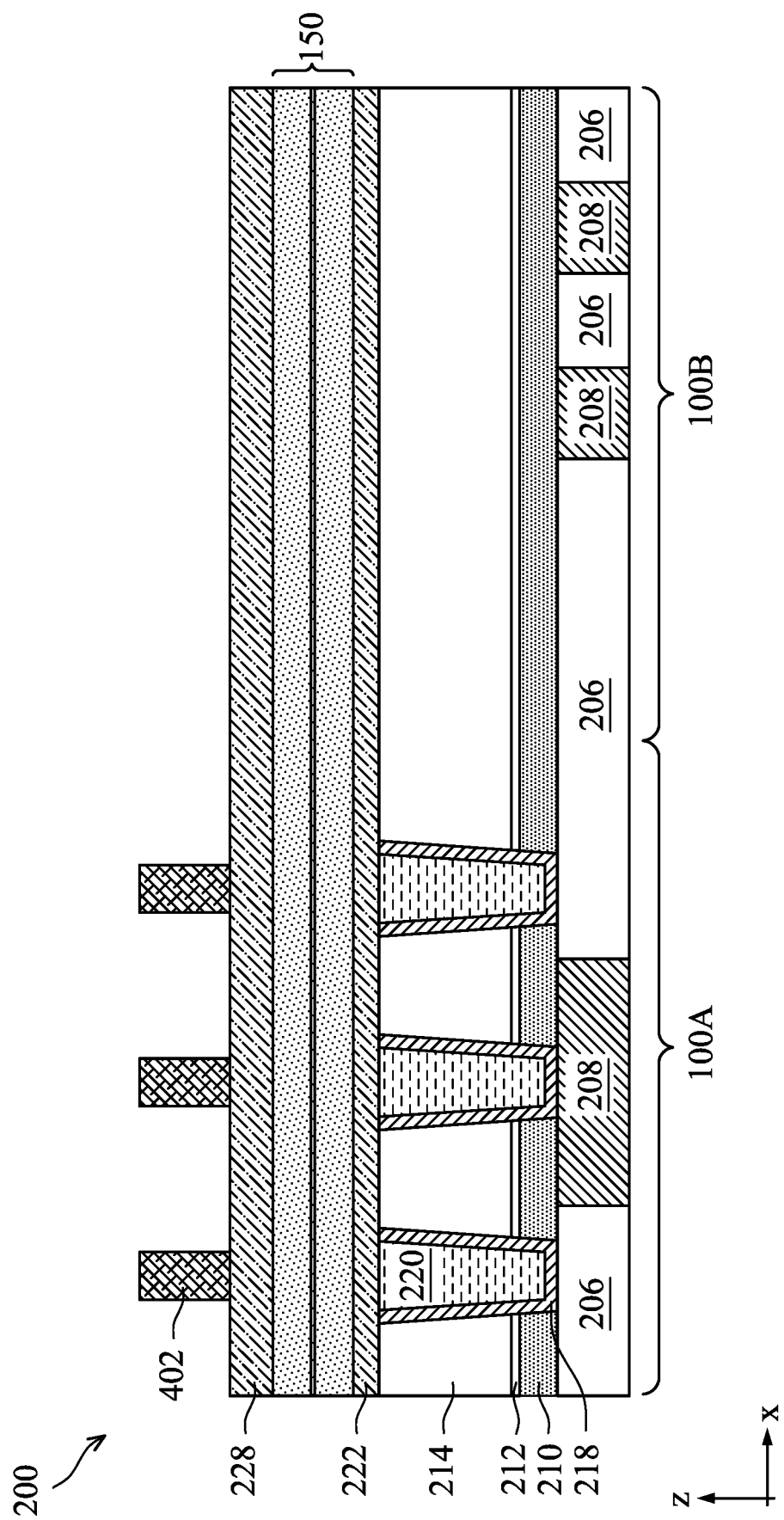
Figure 3E:
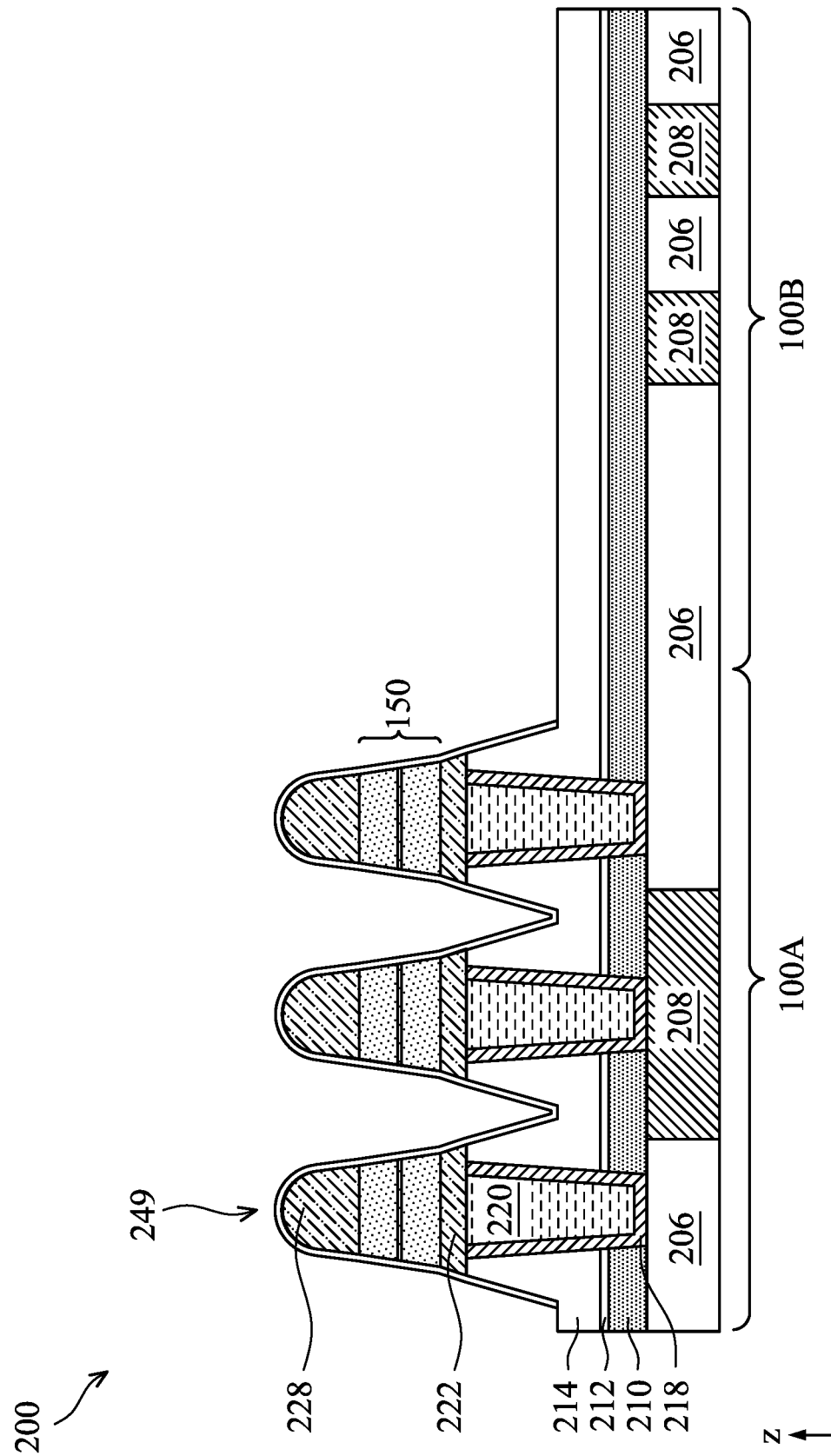

At operation 508, the method 500 (FIG. 2A) patterns the BE layer 222, the MTJ stack 150, and the TE layer 228 into individual MRAM cells 249. For example, using photolithography and etching processes, the operation 508 may form an etch mask 402 that covers the areas of the TE layer 228 that correspond to individual MRAM cells 249 and exposes the rest of the TE layer 228, such as shown in FIG. 3D. Then, the operation 508 etches the TE layer 228, the MTJ stack 150, the BE layer 222, and the dielectric layer 214 through the etch mask 402 to form individual MRAM cells 249, such as shown in FIG. 3E. The etching process may be wet etching, dry etching, reactive ion etching, or other suitable etching methods. The etch mask 402 is removed thereafter, using etching, stripping, ashing, or other suitable methods.

Figure 3F:
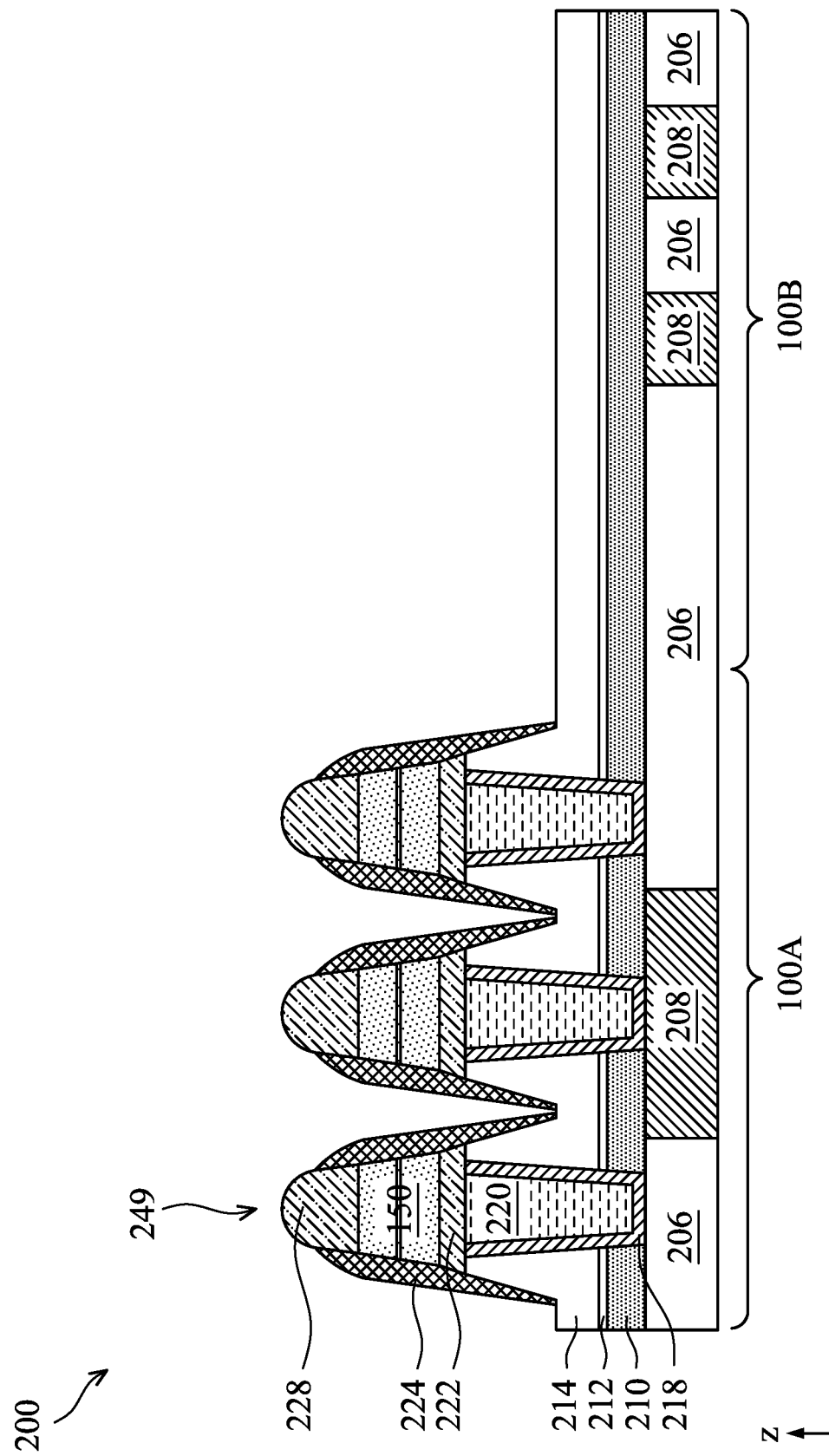

At operation 510, the method 500 (FIG. 2A) forms spacers 224 over the sidewalls of the MRAM cells 249, such as shown in FIG. 3F. In some embodiments, the spacers 224 are considered part of the MRAM cells 249. For example, the operation 510 may deposit a blanket dielectric layer over the device structure 200 in both the MRAM region 100A and the logic region 100B using CVD, ALD, or other suitable methods, then anisotropically etch the blanket dielectric layer to remove it from the top surface of the dielectric layer 214 and from the top surface of the TE 228. Portions of the dielectric layer remain on sidewalls of the MRAM cells 249, becoming the spacers 224. The spacers 224 may include one or more dielectric materials such as silicon oxide ($SiO_x$), silicon nitride ($SiN_x$), silicon oxynitride ($Si_xO_yN_z$), or the like. The spacers 224 may include one or multiple layers of the dielectric materials in various embodiments.

Figure 3G:
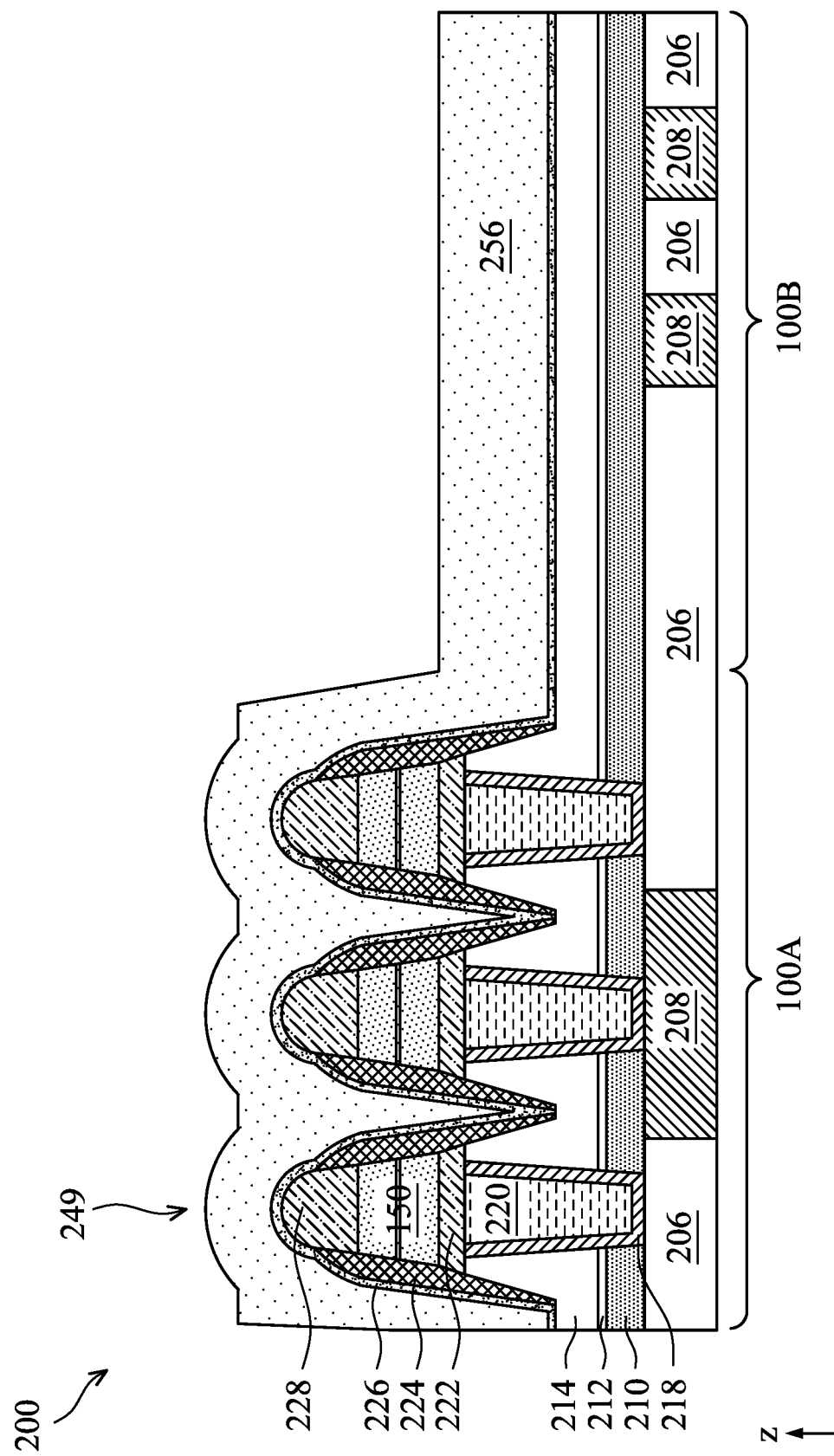

At operation 512, the method 500 (FIG. 2A) forms a protection layer 226 over the spacers 224, the top electrodes 228, and the dielectric layer 214, and forms a dielectric layer 256 over the protection layer 226 in both the MRAM region 100A and the logic region 100B, such as shown in FIG. 3G. For example, the operation 512 may deposit the protection layer 226 using ALD such that it has a substantially uniform thickness in both the MRAM region 100A and the logic region 100B, and then deposit the dielectric layer 256 using ALD such that it has a substantially uniform thickness in both the MRAM region 100A and the logic region 100B. In an embodiment, the protection layer 226 includes a metal-based oxide, such as alumina ($Al_2O_3$). In an embodiment, the dielectric layer 256 includes a dielectric material that is different from the material in the dielectric layer 214. For example, the dielectric layer 256 may include a nitride based dielectric material such as silicon carbonitride.

Figure 3H:
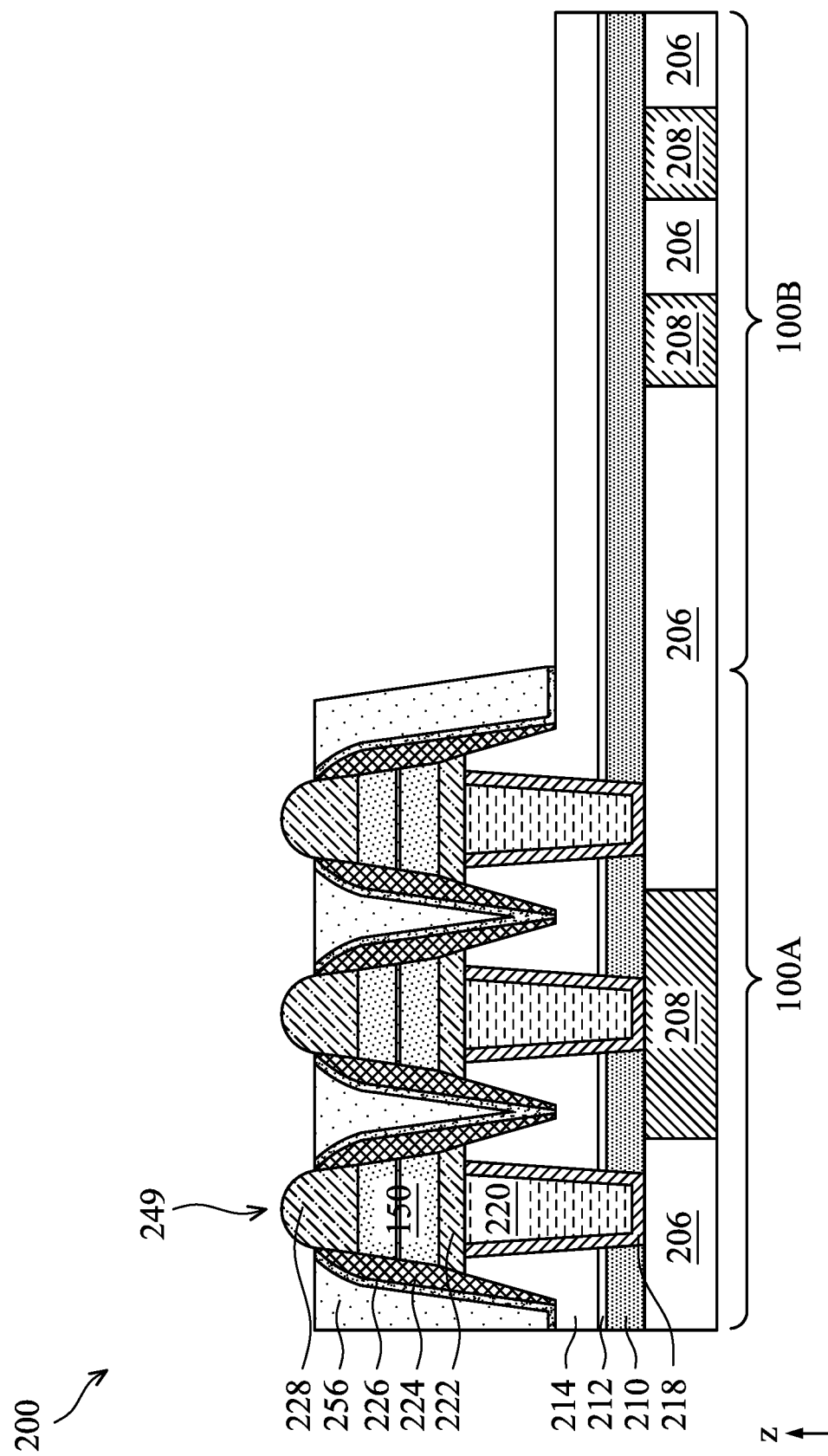
Figure 3I:
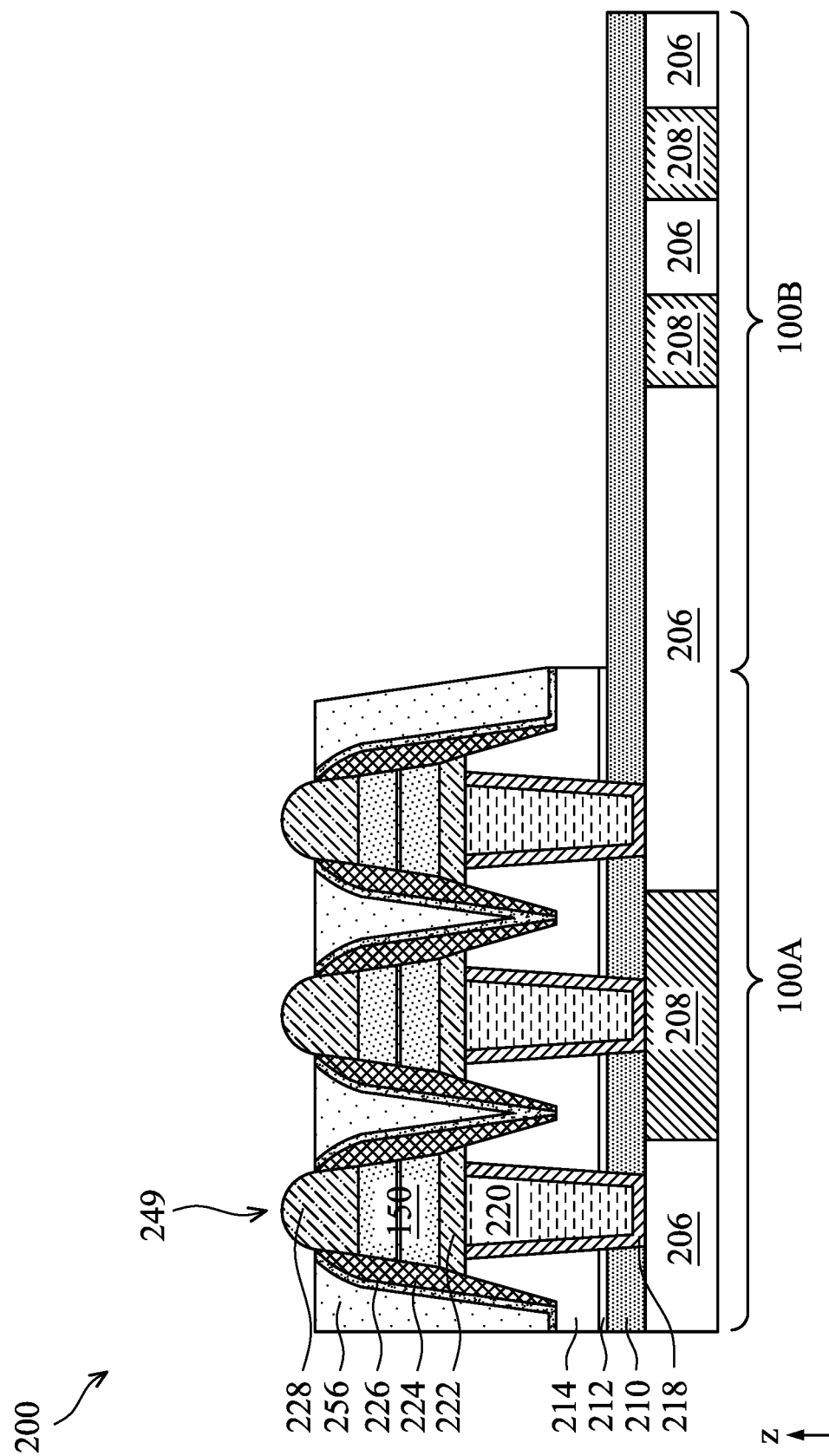

At operation 514, the method 500 (FIG. 2A) removes the dielectric layer 256 and the dielectric layer 214 from the logic region 100B and keeps them in the MRAM region 100A. This may involve one or more etching processes. In an embodiment, the operation 514 performs a first etching process (such as an anisotropic etching process) to the dielectric layer 256 and the protection layer 226 until top portion of the top electrodes 228 are exposed. The first etching process also removes the dielectric layer 256 and the protection layer 226 from the logic region 100B. The resultant structure of the device 200 is shown in FIG. 3H, according to an embodiment. The first etching process reduces the thickness of the dielectric layer 256 in the MRAM region. Portions of the dielectric layer 256 in the MRAM region remain over the sidewalls of the spacers 224. Then, the operation 514 performs a second etching process (such as another anisotropic etching process) to the dielectric layer 214 and the dielectric layer 212, thereby removing them from the logic region 100B. The resultant structure of the device 200 is shown in FIG. 3I, according to an embodiment. In an embodiment, the first and the second etching processes apply the same etchant which etches the dielectric layer 214 at a faster rate than etching the dielectric layer 256. Thus, during the second etching, the dielectric layer 256 in the MRAM region 100A is only slightly etched. In another embodiment, the first and the second etching processes apply different etchants where the first etching process applies an etchant selective to the dielectric layer 256 and the protection layer 226 and the second etching process applies another etchant selective to the dielectric layers 214 and 212. To further such embodiment, the dielectric layer 256 and the top electrodes 228 act as an etch mask during the second etching. In an embodiment, both the first and the second etching processes are dry etching processes. As a result of the operation 514, the barrier layer 210 is exposed in the logic region 100B for subsequent processes. One advantage of the operation 514 is that it does not use photolithography in order to remove the dielectric layer 214 from the logic region 100B. Rather, it uses self-aligned etching. In other words, the etching is self-aligned to the MRAM region. This saves manufacturing costs.

Figure 3J:
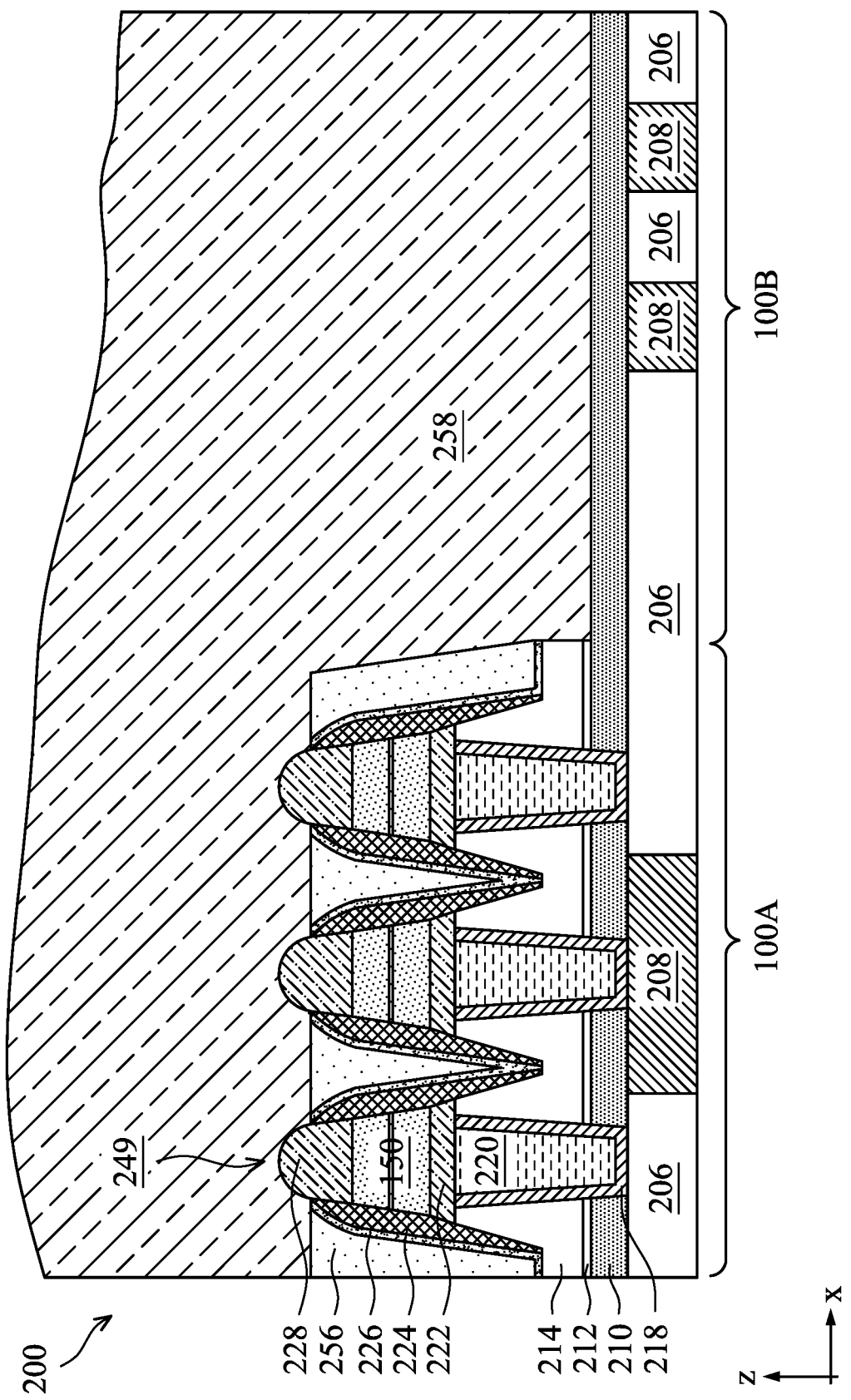

At operation 516, the method 500 (FIG. 2B) deposits an extreme low-k (ELK) dielectric layer 258 using a flowable CVD (FCVD) process onto the device 200, such as shown in FIG. 3J. The dielectric layer 258 fills the logic device regions 100B (one shown in FIG. 3J) and extends above the structures in the MRAM regions 100A (one shown in FIG. 3J). The top surface of the dielectric layer 258 may not be planar at this fabrication stage, but the dielectric layer 258 is sufficiently thick such that its top surface in both the MRAM region 100A and the logic region 100B extends much higher than the top electrodes 228. In an embodiment, the ELK dielectric layer 258 includes a material that includes silicon, oxygen, carbon, hydrogen, and nitrogen and provides a dielectric constant k less than about 2.5. In an embodiment, various precursors having silicon, oxygen, carbon, hydrogen, nitrogen, and/or other elements are provided to a deposition chamber. The precursors react to form a flowable material that fills various topography of the device 200. The deposition chamber provides suitable pressure and temperature for the precursors to react. For example, the deposition chamber may maintain a pressure in a range from about 1 torr to about 10 and a temperature in a range from about 300° C. to about 400° C. If the pressure is too small (such as less than 1 torr), the plasma might be insufficient. If the pressure is too large (such as more than 10 torr), the deposition rate might be insufficient. The temperature is selected to be in this range in order to protect various elements already in the device 200 and induce efficient reaction among the precursors. If the temperature is too high (such as higher than 400° C.), the MRAM cells 249 as well as elements in the interconnect structure 308 and the transistor structure 101 (FIG. 1C) might be damaged. If the temperature is too low (such as lower than 300° C.), the reaction among the precursors might not occur or might be very slow.

Figure 3K:
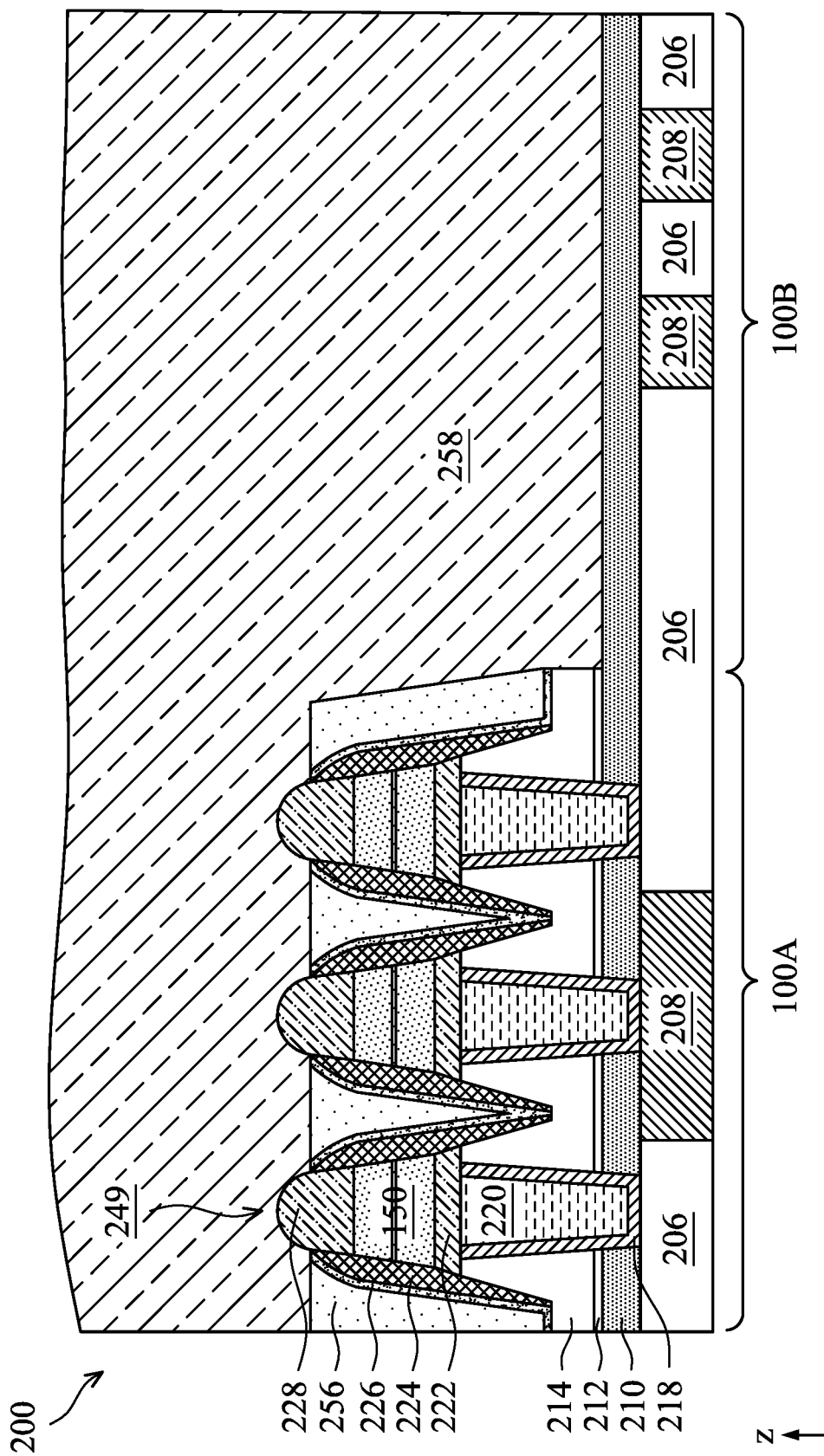

At operation 518, the method 500 (FIG. 2B) reflows the ELK dielectric layer 258. For example, the operation 518 may soak (or maintain) the ELK dielectric layer 258 at temperature in a range from about 350° C. to about 400° C. such as from about 380° C. to about 400° C., for a processing time in a range from about 2 hours to about 4 hours depending the thickness of the ELK dielectric layer 258 (the thinner the layer, the less the processing time), and in $N_2$ gas ambient. The temperature is selected to be in this range for similar reasons as stated above—to protect various elements already in the device 200 and induce efficient reflowing. If the temperature is too high (such as higher than 400° C.), the MRAM cells 249 as well as elements in the interconnect structure 308 and the transistor structure 101 (FIG. 1C) might be damaged. If the temperature is too low (such as lower than 350° C.), the reflowing might not occur or might be very slow. The reflowing improves the film density and removes voids and/or seams in the ELK dielectric layer 258. It also substantially flattens the top surface of the ELK dielectric layer 258, such as shown in FIG. 3K. For example, the upper surface of the ELK dielectric layer 258 in FIG. 3K is flatter than the upper surface of the ELK dielectric layer 258 in FIG. 3J.

At operation 520, the method 500 (FIG. 2B) cures the ELK dielectric layer 258 to remove moisture and residual elements introduced by the FCVD process. This also densifies and hardens the ELK dielectric layer 258, making the film more suitable for subsequent processing (such as buffing and etching discussed below). In an embodiment, the ELK dielectric layer 258 is cured by using ultraviolet (UV) radiation at a temperature in a range from about 300° C. to about 400° C. for a processing time in a range from about 10 minutes to about 15 minutes. The UV curing temperature is selected to be in this range for similar reasons as stated above—to protect various elements already in the device 200 and induce efficient curing of the ELK dielectric layer 258. The ELK dielectric layer 258 may be cured by other methods in various embodiments, such as exposing the ELK dielectric layer 258 to heated deionized water, inductively coupled plasma, ozone, e-beam, basic vapors, or other treatment.

Figure 3L:
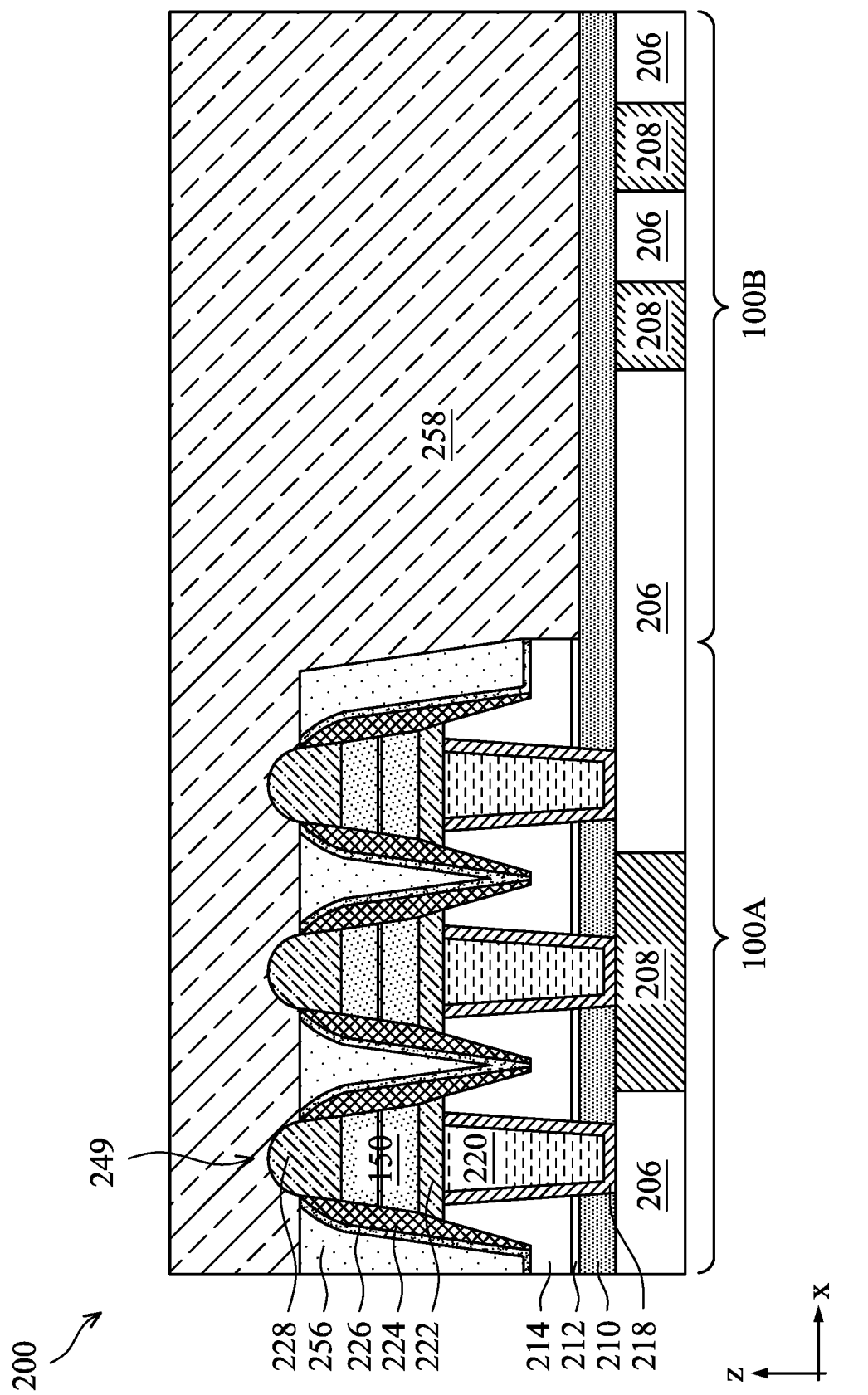

At operation 522, the method 500 (FIG. 2B) buffs the ELK dielectric layer 258 to planarize or substantially planarize the top surface of the ELK dielectric layer 258 and to reduce the thickness of the ELK dielectric layer 258 to a desired range for subsequent processing. A resultant structure of the device 200 is shown in FIG. 3L according to an embodiment. For example, the operation 522 may buff the top surface of the ELK dielectric layer 258 with one or more buffing pads and may further apply one or more buffing solutions to the buffing pads during the buffing process. In the present embodiment, the operation 522 uses a timer (rather than using an end-point detection like in a CMP process) to control how much of the ELK dielectric layer 258 is removed by the buffing. For example, the operation 522 may perform the buffing for about 5 seconds to about 20 seconds. If duration of the buffing is too short (such as less than 5 seconds), it might be insufficient to complete the planarization (i.e., the upper surface of the ELK dielectric layer 258 may not be sufficiently planar). If duration of the buffing is too long (such as more than 20 seconds), the buffing might remove too much material from the ELK dielectric layer 258 and the manufacturing costs might be unnecessarily increased. As a result of the buffing, the upper surface of the ELK dielectric layer 258 becomes planar or substantially planar. For example, the upper surface of the ELK dielectric layer 258 in FIG. 3L is flatter than the upper surface of the ELK dielectric layer 258 in FIG. 3K. Due to the FCVD, the reflowing, the curing, and the buffing, the method 500 forms the ELK dielectric layer 258 that extends across the entire surface of the device 200 (including both the MRAM region 100A and the logic region 100B) and has a top surface that is planar or substantially planar. This is achieved without using a photolithography process (such as to process the MRAM and logic regions separately for the ELK dielectric layer 258) and without using a CMP process, thereby reducing the manufacturing costs. After the operation 522 finishes, the device 200 is made ready to form metal vias and lines in the ELK dielectric layer 258 in the logic region 100B.

Figure 3M:
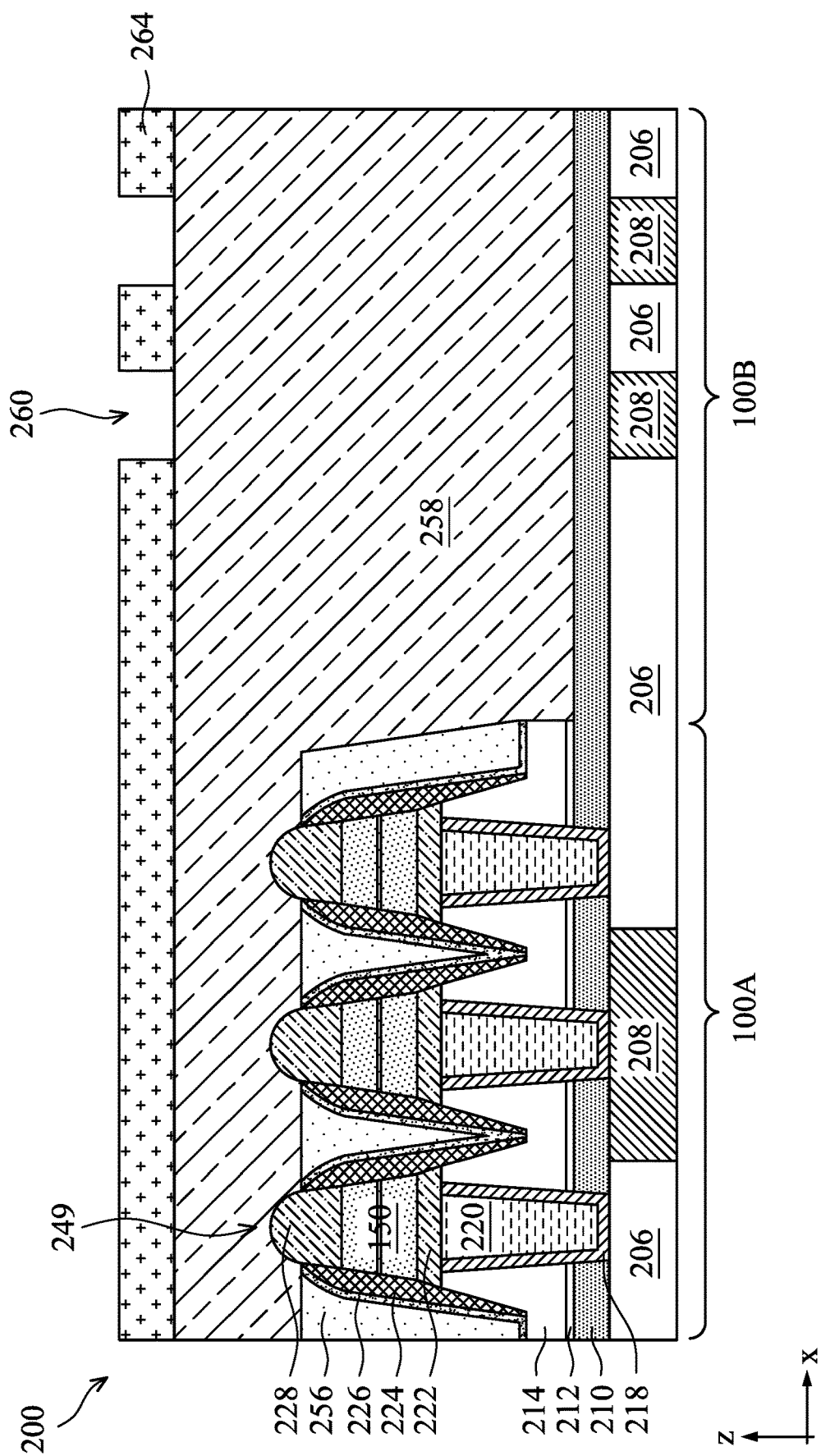

At operation 524, the method 500 (FIG. 2B) forms an etch mask 264 over the ELK dielectric layer 258, such as shown in FIG. 3M. The etch mask 264 provides openings 260 over the logic region 100B and covers the MRAM region 100A. In an embodiment, the etch mask 264 includes a material that has etch selectivity with respect to the dielectric layers 258 and 210 in an etching process. For example, the etch mask 264 may include a resist pattern and may further include a patterned hard mask under the resist pattern in an embodiment. For example, the patterned hard mask may include titanium nitride and may have a thickness in a range of about 10 nm to about 40 nm in an embodiment. The operation 524 may include depositing a hard mask layer over the ELK dielectric layer 258, coating a photoresist over the hard mask layer, performing photolithography (such as exposing and developing) to the photoresist layer to form a resist pattern, and etching the hard mask layer through the resist pattern to form a patterned hard mask. The patterned hard mask and the resist pattern collectively form the etch mask 264. In the present embodiment, each of the openings 260 corresponds to a via or a metal line to be formed in the ELK dielectric layer 258.

Figure 3N:
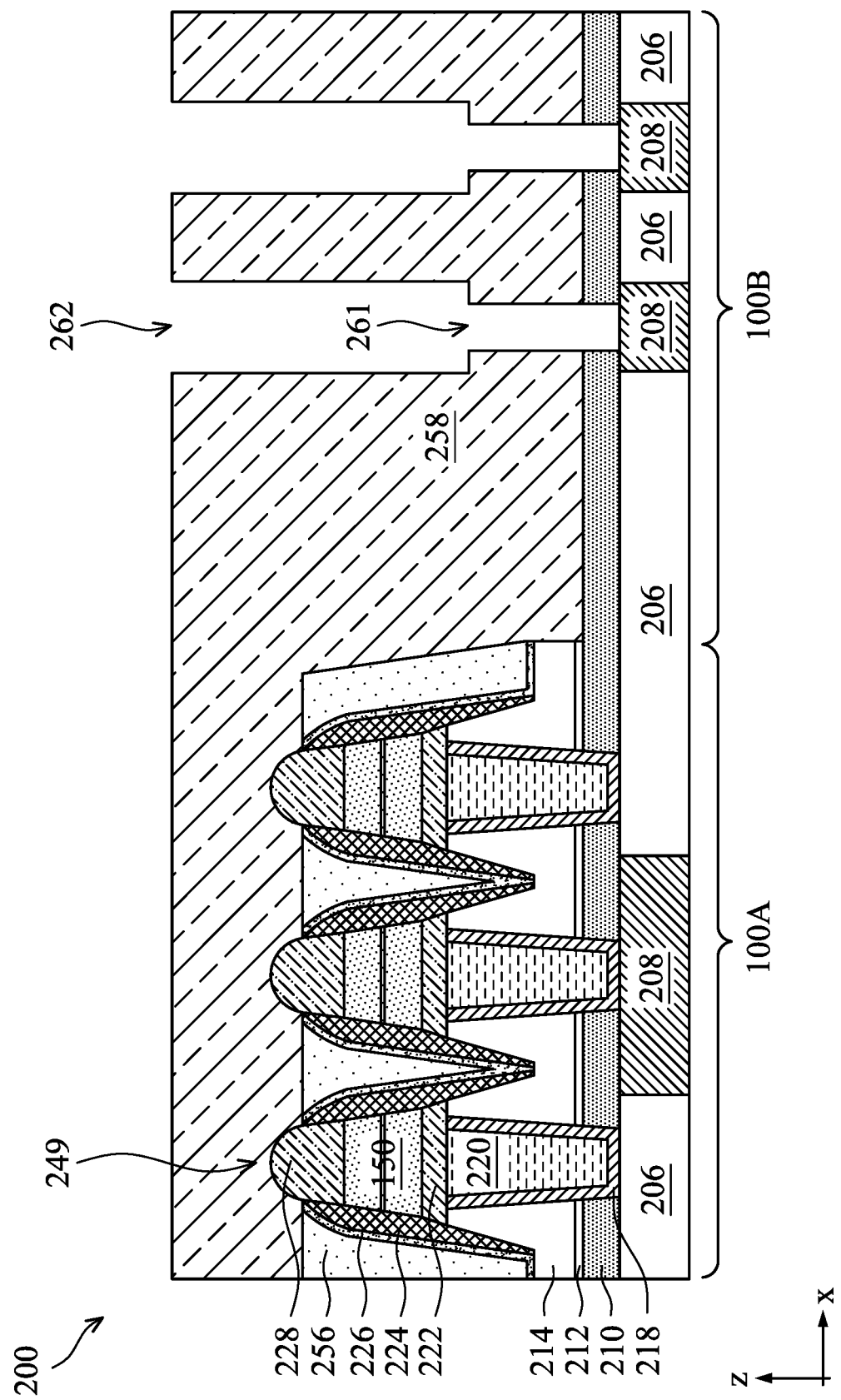

At operation 526, the method 500 (FIG. 2B) etches the ELK dielectric layer 258 and the barrier layer 210 through the etch mask 264 to form trenches 262 and holes 261 and removes the etch mask 264 thereafter. The resultant structure is shown in FIG. 3N according to an embodiment. The trenches 262 correspond to metal lines and the holes 261 correspond to metal vias. The operation 526 may perform two separate etching processes to form the trenches 262 and the holes 261. At least one of the etching processes is performed with the presence of the etch mask 264, and the other etching process may be performed with the presence of another etch mask (not shown).

Figure 3O:
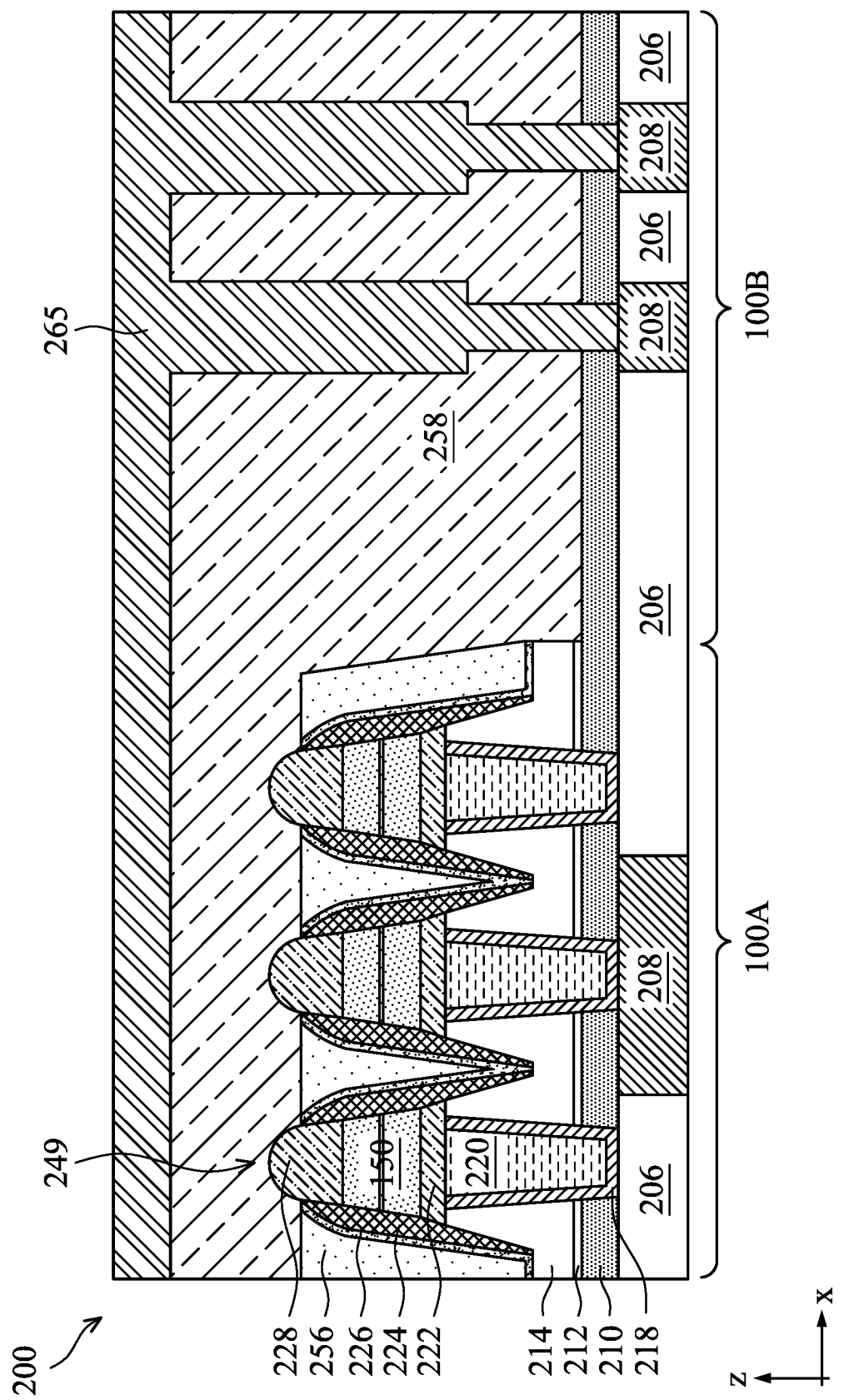
Figure 3P:
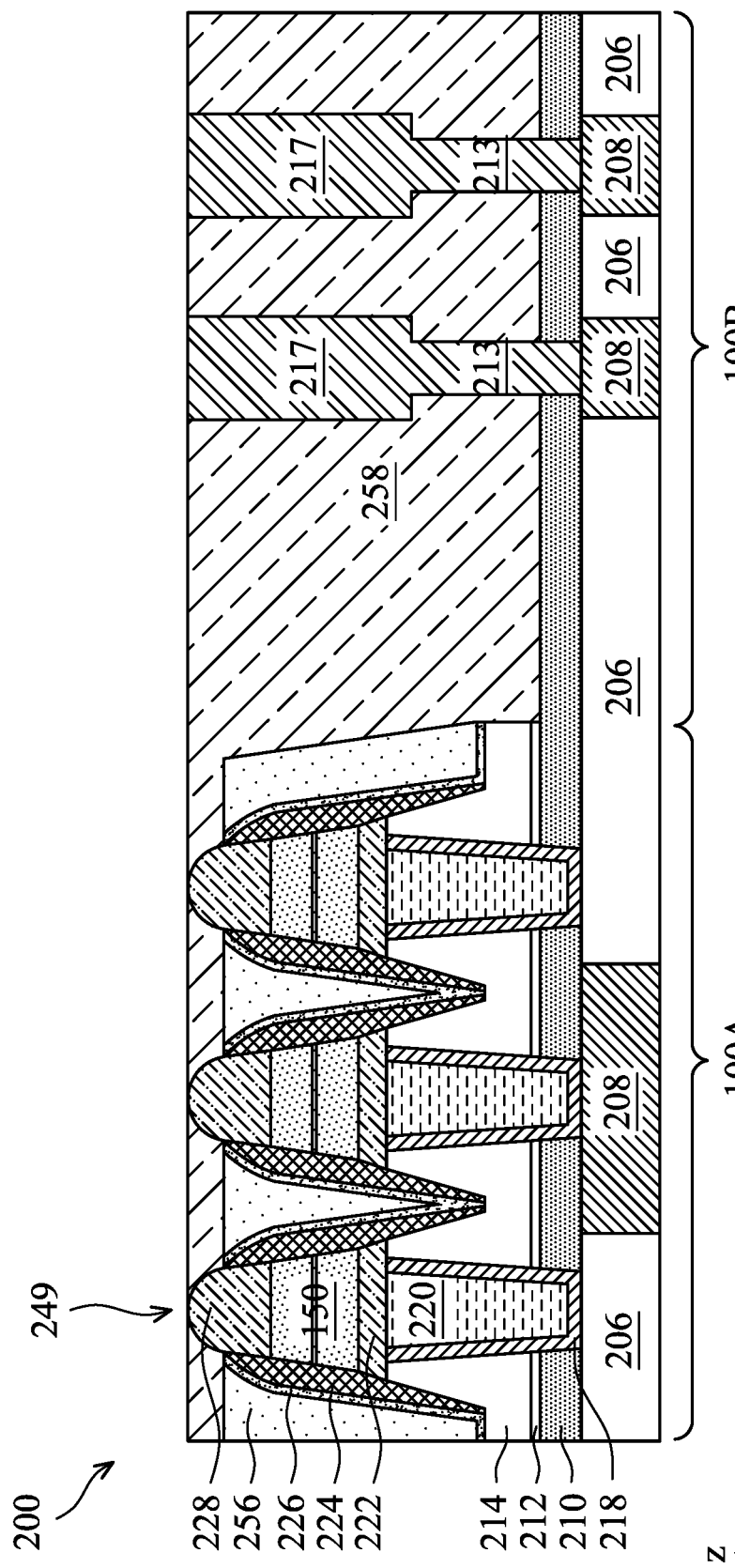

At operation 528, the method 500 (FIG. 2B) deposits one or more metallic materials 265 into the trenches 262 and the holes 261 and over the top surface of the dielectric layer 258, such as shown in FIG. 3O. The one or more metallic materials 265 may include a barrier layer or a seed layer having Ta, TaN, Ti, TiN, or other suitable conductive material and a low-resistance fill metal such as copper, aluminum, or other suitable metal. The one or more metallic materials 265 may be deposited using CVD, PVD, ALD, plating, or other suitable processes.

Figures 1, 3P:
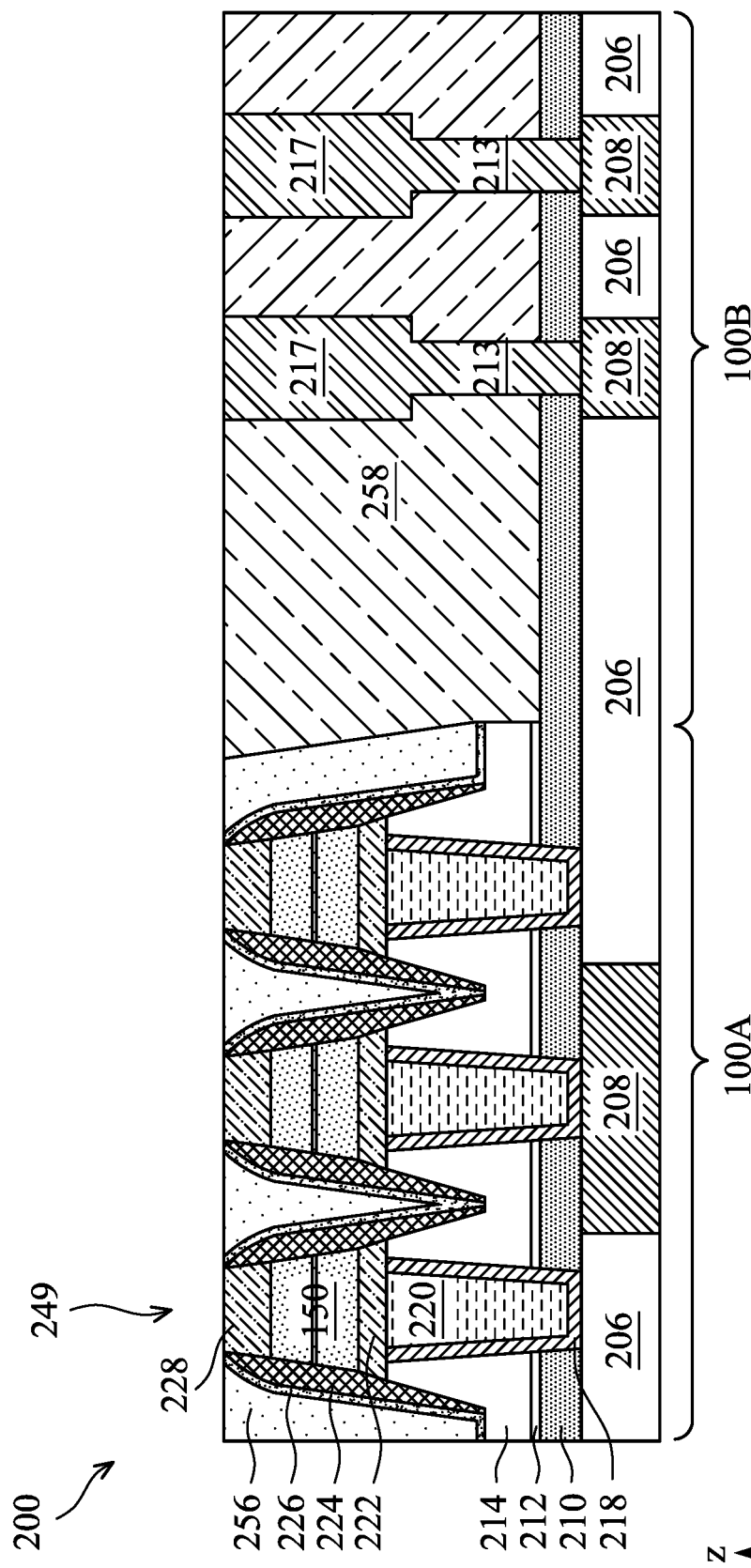

At operation 530, the method 500 (FIG. 2B) performs a CMP process to the one or more metallic materials 265 to remove them from the top surface of the dielectric layer 258. In an embodiment, the CMP process is performed until the top electrodes 228 are exposed (in other words, the CMP process uses the top electrodes 228 for end-point detection). The resultant structure of the structure 200 is shown in FIG. 3P according to an embodiment. Remaining portions of the one or more metallic materials 265 in the trenches 262 become the metal lines 217. Remaining portions of the one or more metallic materials 265 in the holes 261 become the metal vias 213. In the embodiment depicted in FIG. 3P, portions of the ELK dielectric layer 258 remain between adjacent MTJ cells 249 and above the dielectric layer 256. In another embodiment, the CMP process is performed until the dielectric layer 256 is exposed. The resultant structure of the device 200 is shown in FIG. 3P-1 according to such embodiment. In the embodiment depicted in FIG. 3P-1, the ELK dielectric layer 258 between adjacent MTJ cells 249 is removed. Only a portion of the ELK dielectric layer 258 remains in the MRAM region 100A, which is on the sidewall of the dielectric layer 256 at the boundary between the MRAM region 100A and the logic region 100B.

At operation 532, the method 500 (FIG. 2B) performs further fabrication to the device 200, such as forming the metal layer 306 and forming one or more metal layers over the metal layer 306, forming passivation layer(s), and performing more back end of line (BEOL) processes.

Although not intended to be limiting, one or more embodiments of the present disclosure provide many benefits to a semiconductor device and the formation thereof. For example, embodiments of the present disclosure form an MRAM array and logic devices integrated in the same device where an extreme low-k (ELK) dielectric layer is formed in a logic device region adjacent an MRAM region using flowable CVD deposition and other treatments such as reflowing, curing, and buffing, and without using a photolithography process. This reduces topography variations at the boundary between the logic device region and adjacent MRAM device region(s). This also reduces manufacturing costs. Furthermore, embodiments of the present disclosure can be readily integrated into existing semiconductor fabrication processes.

In one example aspect, the present disclosure is directed to a method that includes providing a structure having a memory device region and a logic device region, wherein the structure includes a first metal layer and a dielectric barrier layer over the first metal layer in both the memory device region and the logic device region, and wherein the structure further includes a first dielectric layer over the dielectric barrier layer, multiple magnetic tunneling junction (MTJ) devices over the first metal layer, the dielectric barrier layer, and the first dielectric layer, and a second dielectric layer over the first dielectric layer and the MTJ devices, wherein the first dielectric layer, the MTJ devices, and the second dielectric layer are in the memory device region and not in the logic device region. The method further includes depositing an extreme low-k dielectric layer using flowable chemical vapor deposition (FCVD) over the MTJ devices and the second dielectric layer in the memory device region and over the dielectric barrier layer in the logic device region; and buffing the extreme low-k dielectric layer to planarize a top surface of the extreme low-k dielectric layer in both the memory device region and the logic device region.

In an embodiment, after the depositing and before the buffing, the method further includes reflowing the extreme low-k dielectric layer. In a further embodiment, after the reflowing and before the buffing, the method further includes curing the extreme low-k dielectric layer using ultraviolet radiation.

In an embodiment of the method, after the buffing, the top surface of the extreme low-k dielectric layer is substantially planar and a first portion of the extreme low-k dielectric layer in the memory device region is thinner than a second portion of the extreme low-k dielectric layer in the logic device region.

In an embodiment, after the buffing, the method further includes forming a patterned hard mask over the top surface of the extreme low-k dielectric layer; etching a trench through the patterned hard mask and into the extreme low-k dielectric layer and the dielectric barrier layer in the logic device region, thereby exposing the first metal layer in the logic device region; and forming a conductive feature in the trench. In a further embodiment, after the forming of the conductive feature, the method further includes performing a chemical mechanical planarization process to the structure until top portions of the MTJ devices are exposed.

In some embodiments of the method, the second dielectric layer includes silicon carbonitride and the first dielectric layer includes silicon oxide. In some embodiments, the extreme low-k dielectric layer includes silicon, oxygen, carbon, hydrogen, and nitrogen.

In another example aspect, the present disclosure is directed to a method that includes providing a structure having a memory device region and a logic device region, wherein the structure includes, in both the memory device region and the logic device region, a first metal layer, a dielectric barrier layer over the first metal layer, and a first dielectric layer over the dielectric barrier layer, wherein the structure further includes, in the memory device region and not in the logic device region, multiple magnetic tunneling junction (MTJ) devices over the first metal layer, the dielectric barrier layer, and the first dielectric layer. The method further includes depositing a second dielectric layer over the MTJ devices in the memory device region and over the first dielectric layer in the logic device region; etching the second dielectric layer in both the memory device region and the logic device region simultaneously, wherein the etching exposes top portions of the MTJ devices and removes the first and the second dielectric layers from the logic device region, and wherein a portion of the second dielectric layer remains in the memory device region and over sidewalls of the MTJ devices; and depositing an extreme low-k dielectric layer using flowable chemical vapor deposition (FCVD) over the MTJ devices and the portion of the second dielectric layer in the memory device region and over the dielectric barrier layer in the logic device region.

In an embodiment, after the depositing, the method further includes reflowing the extreme low-k dielectric layer. In an embodiment, after the reflowing, the method further includes curing the extreme low-k dielectric layer using ultraviolet radiation. In an embodiment, after the curing, the method further includes buffing the extreme low-k dielectric layer to planarize a top surface of the extreme low-k dielectric layer in both the memory device region and the logic device region. In an embodiment, after the buffing, the method further includes etching trenches into the extreme low-k dielectric layer and the dielectric barrier layer in the logic device region, the trenches exposing the first metal layer in the logic device region; and depositing a conductive material in the trenches. In an embodiment, after the depositing of the conductive material, the method further includes performing a chemical mechanical planarization (CMP) process to the structure until the top portions of the MTJ devices are exposed. In an embodiment, after the performing of the CMP process, a portion of the extreme low-k dielectric layer remains on a sidewall of the second dielectric layer in the memory device region.

In yet another example aspect, the present disclosure is directed to a structure having a memory device region and a logic device region. The structure includes a first metal layer extends in both the memory device region and the logic device region; a dielectric barrier layer over the first metal layer in both the memory device region and the logic device region; a first dielectric layer over the dielectric barrier layer in the memory device region and not in the logic device region; and multiple magnetic tunneling junction (MTJ) devices in the memory device region and not in the logic device region, wherein the MTJ devices are disposed over the first metal layer, the dielectric barrier layer, and the first dielectric layer. The structure further includes a second dielectric layer in the memory device region and not in the logic device region, wherein the second dielectric layer is disposed over the first dielectric layer and the MTJ devices; an extreme low-k dielectric layer over the dielectric barrier layer in the logic device region and over the first dielectric layer in the memory device region, wherein a portion of the extreme low-k dielectric layer is disposed directly on a sidewall of the second dielectric layer in the memory device region; and a conductive feature in the logic device region, penetrating the extreme low-k dielectric layer and the dielectric barrier layer, and electrically connecting to the first metal layer.

In an embodiment of the structure, the second dielectric layer includes silicon carbonitride and the first dielectric layer includes silicon oxide. In another embodiment, the extreme low-k dielectric layer includes silicon, oxygen, carbon, hydrogen, and nitrogen.

In an embodiment of the structure, each of the MTJ devices includes a bottom electrode via that penetrates the first dielectric layer and the dielectric barrier layer and electrically connects to the first metal layer, a bottom electrode over the bottom electrode via and the first dielectric layer, an MTJ stack over the bottom electrode, a top electrode over the MTJ stack, and a dielectric spacer over sidewalls of the MTJ stack and the first dielectric layer. In an embodiment, the structure further includes a layer comprising aluminum oxide and disposed between the dielectric spacer and the second dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a structure having a memory device region and a logic device region, wherein the structure includes a first metal layer and a dielectric barrier layer over the first metal layer in both the memory device region and the logic device region, and wherein the structure further includes a first dielectric layer over the dielectric barrier layer, multiple magnetic tunneling junction (MTJ) devices over the first metal layer, the dielectric barrier layer, and the first dielectric layer, and a second dielectric layer over the first dielectric layer and the MTJ devices, wherein the first dielectric layer, the MTJ devices, and the second dielectric layer are in the memory device region and not in the logic device region;
depositing an extreme low-k dielectric layer using flowable chemical vapor deposition (FCVD) over the MTJ devices and the second dielectric layer in the memory device region and over the dielectric barrier layer in the logic device region;
buffing the extreme low-k dielectric layer to planarize a top surface of the extreme low-k dielectric layer in both the memory device region and the logic device region;
after the buffing, forming a patterned hard mask over the top surface of the extreme low-k dielectric layer;
etching a trench through the patterned hard mask and into the extreme low-k dielectric layer and the dielectric barrier layer in the logic device region, thereby exposing the first metal layer in the logic device region;
forming a conductive feature in the trench; and
after the forming of the conductive feature, performing a chemical mechanical planarization process to the structure until top portions of the MTJ devices are exposed.

2. The method of claim 1, after the depositing and before the buffing, further comprising:
reflowing the extreme low-k dielectric layer.

3. The method of claim 2, after the reflowing and before the buffing, further comprising:
curing the extreme low-k dielectric layer using ultraviolet radiation.

4. The method of claim 1, wherein, after the buffing, the top surface of the extreme low-k dielectric layer is planar and a first portion of the extreme low-k dielectric layer in the memory device region is thinner than a second portion of the extreme low-k dielectric layer in the logic device region.

5. The method of claim 1, wherein the second dielectric layer includes silicon carbonitride and the first dielectric layer includes silicon oxide.

6. The method of claim 1, wherein the extreme low-k dielectric layer includes silicon, oxygen, carbon, hydrogen, and nitrogen.

7. The method of claim 1, wherein the extreme low-k dielectric layer has dielectric constant less than 2.5.

8. A method, comprising:
providing a structure having a memory device region and a logic device region, wherein the structure includes, in both the memory device region and the logic device region, a first metal layer, a dielectric barrier layer over the first metal layer, and a first dielectric layer over the dielectric barrier layer, wherein the structure further includes, in the memory device region and not in the logic device region, multiple magnetic tunneling junction (MTJ) devices over the first metal layer, the dielectric barrier layer, and the first dielectric layer;
depositing a second dielectric layer over the MTJ devices in the memory device region and over the first dielectric layer in the logic device region;
etching the second dielectric layer in both the memory device region and the logic device region simultaneously, wherein the etching exposes top portions of the MTJ devices and removes the first and the second dielectric layers from the logic device region, and wherein a portion of the second dielectric layer remains in the memory device region and over sidewalls of the MTJ devices; and
depositing an extreme low-k dielectric layer using flowable chemical vapor deposition (FCVD) over the MTJ devices and the portion of the second dielectric layer in the memory device region and over the dielectric barrier layer in the logic device region.

9. The method of claim 8, after the depositing, further comprising:
reflowing the extreme low-k dielectric layer.

10. The method of claim 9, after the reflowing, further comprising:
curing the extreme low-k dielectric layer using ultraviolet radiation.

11. The method of claim 10, after the curing, further comprising:
buffing the extreme low-k dielectric layer to planarize a top surface of the extreme low-k dielectric layer in both the memory device region and the logic device region.

12. The method of claim 11, after the buffing, further comprising:
etching trenches into the extreme low-k dielectric layer and the dielectric barrier layer in the logic device region, the trenches exposing the first metal layer in the logic device region; and
depositing a conductive material in the trenches.

13. The method of claim 12, after the depositing of the conductive material, further comprising:
performing a chemical mechanical planarization (CMP) process to the structure until the top portions of the MTJ devices are exposed.

14. The method of claim 13, wherein after the performing of the CMP process, a portion of the extreme low-k dielectric layer remains on a sidewall of the second dielectric layer in the memory device region.

15. A method, comprising:
providing a structure having a memory device region and a logic device region, wherein the structure includes multiple magnetic tunneling junction (MTJ) devices in the memory device region and further includes a first dielectric layer in both the memory device region and the logic device region;
depositing a second dielectric layer over the MTJ devices in the memory device region and over the first dielectric layer in the logic device region;
applying a first etching process to the second dielectric layer in both the memory device region and the logic device region simultaneously until top portions of the MTJ devices are exposed and the first dielectric layer in the logic device region is exposed;
applying a second etching process to the first dielectric layer using the second dielectric layer and the top portions of the MTJ devices as an etch mask, thereby removing the first dielectric layer from the logic device region;
after the applying of the second etching process, depositing an extreme low-k dielectric layer using flowable chemical vapor deposition (FCVD) over the MTJ devices and the second dielectric layer in the memory device region and over the logic device region; and curing the extreme low-k dielectric layer using ultraviolet radiation.

16. The method of claim 15, after the depositing and before the curing, further comprising:

reflowing the extreme low-k dielectric layer.

17. The method of claim 15, after the curing, further comprising:

buffing the extreme low-k dielectric layer to planarize a top surface of the extreme low-k dielectric layer in both the memory device region and the logic device region.

18. The method of claim 17, after the buffing, further comprising:

etching a trench into the extreme low-k dielectric layer in the logic device region;

forming a conductive feature in the trench; and performing a chemical mechanical planarization process to the structure including the conductive feature until top portions of the MTJ devices are exposed.

19. The method of claim 15, before the depositing of the second dielectric layer, further comprising:

depositing a dielectric protection layer over the MTJ devices in the memory device region and over the first dielectric layer in the logic device region, wherein the second dielectric layer is deposited over the dielectric protection layer.

20. The method of claim 15, wherein the extreme low-k dielectric layer includes silicon, oxygen, carbon, hydrogen, and nitrogen, and provides a dielectric constant less than about 2.5.

* * * * *